US007279266B2

(12) United States Patent
Yanaka et al.

(10) Patent No.: US 7,279,266 B2
(45) Date of Patent: Oct. 9, 2007

(54) PHOTOSENSITIVE COMPOSITION AND LITHOGRAPHIC PRINTING PLATE PRECURSOR USING THE SAME

(75) Inventors: Hiromitsu Yanaka, Shizuoka (JP); Takahiro Goto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/947,260

(22) Filed: Sep. 23, 2004

(65) Prior Publication Data

US 2005/0064331 A1 Mar. 24, 2005

(30) Foreign Application Priority Data

Sep. 24, 2003 (JP) .......................... P.2003-331528

(51) Int. Cl.

*G03C 1/73* (2006.01)
*G03F 7/027* (2006.01)
*G03F 7/029* (2006.01)
*G03F 7/033* (2006.01)
*G03F 7/09* (2006.01)

(52) U.S. Cl. .............................. 430/285.1; 430/281.1; 430/944; 430/284.1; 430/921; 430/905; 430/906; 430/910; 430/271.1; 430/273.1; 430/278.1

(58) Field of Classification Search ............. 430/281.1, 430/285.1, 284.1, 914, 921, 925, 944, 905, 430/271.1, 273.1, 302

See application file for complete search history.

(56) References Cited

U.S. PATENT DOCUMENTS

| | | | | |
|---|---|---|---|---|
| 5,914,211 | A * | 6/1999 | Hashino et al. | 430/166 |
| 6,001,298 | A * | 12/1999 | McAloon | 264/401 |
| 6,576,401 | B2 * | 6/2003 | Teng | 430/303 |
| 2002/0064728 | A1 * | 5/2002 | Weed et al. | 430/281.1 |
| 2003/0068575 | A1 | 4/2003 | Yanaka | |
| 2003/0082475 | A1 | 5/2003 | Teng | |
| 2005/0069810 | A1 * | 3/2005 | Goto | 430/270.1 |
| 2006/0060097 | A1 * | 3/2006 | Sunagawa | 101/463.1 |

FOREIGN PATENT DOCUMENTS

| | | | | |
|---|---|---|---|---|
| EP | 1 176 007 | A2 | | 1/2002 |
| EP | 1 176 467 | A1 | * | 1/2002 |
| EP | 1 182 032 | A2 | | 2/2002 |
| EP | 1 285 749 | A2 | | 2/2003 |
| JP | 54-92723 | A | | 7/1979 |
| JP | 54-25957 | B2 | | 8/1979 |
| JP | 54-34327 | B2 | | 10/1979 |
| JP | 58-12577 | B2 | | 3/1983 |
| JP | 59-44615 | A | | 3/1984 |
| JP | 59-53836 | A | | 3/1984 |
| JP | 59-71048 | A | | 4/1984 |
| JP | 2712564 | B2 | | 10/1997 |
| JP | 10-195119 | A | | 7/1998 |
| JP | 2002-40652 | A | | 2/2002 |
| JP | 2002-139843 | | * | 5/2002 |
| WO | WO95/01257 | | * | 1/1995 |

OTHER PUBLICATIONS

Machine-assisted English translation of JP 2002-139843, provided by JPO.*

European Search Report dated Dec. 22, 2004.

* cited by examiner

*Primary Examiner*—Sin Lee
(74) *Attorney, Agent, or Firm*—Sughrue Mion Pllc.

(57) ABSTRACT

A photosensitive composition comprising:

(A) a polymerizable compound represented by the following formula (I):

$$A—\{O—[(CH(—R^1)CH(—R^2))_m—O]_n—C(=O)—C(—R^3)=CH_2\}_p \quad (I)$$

wherein $R^1$, $R^2$ and $R^3$ each represents a hydrogen atom or a methyl group, A represents a polyhydric alcohol residue or a polyhydric phenol residue, m represents an integer of from 1 to 6, n represents an integer of from 1 to 20, and p represents an integer of from 1 to 6;

(B) an infrared absorber; and (C) an onium salt.

24 Claims, No Drawings

PHOTOSENSITIVE COMPOSITION AND LITHOGRAPHIC PRINTING PLATE PRECURSOR USING THE SAME

FIELD OF THE INVENTION

The present invention relates to a photosensitive composition and a lithographic printing plate precursor using the same. Specifically, the present invention relates to a photosensitive composition useful as the photosensitive layer of a negative lithographic printing plate precursor, and also relates to a negative lithographic printing plate precursor using the photosensitive composition.

BACKGROUND OF THE INVENTION

As lithographic printing plate precursors, those comprising a hydrophilic support having provided thereon a lipophilic photosensitive resin layer have hither to been widely used. As the plate-making methods, methods of obtaining desired printing plates by mask exposure (open-frame-exposure) via a lith film and then dissolving and removing the non-image area are ordinarily used.

Digitized techniques of electronically processing, accumulating and outputting image data using a computer have prevailed in recent years, and various image output systems corresponding to these digitized techniques have been put to practical use. As a result, a computer-to-plate (CTP) technique of directly making a printing plate by scanning digitized image data without using a lith film with highly convergent light such as a laser beam is eagerly desired. With such a tendency, it has become an important technical subject to obtain a printing plate precursor well adapted to such a purpose.

As such a lithographic printing plate precursor capable of scanning exposure, a lithographic printing plate precursor having a constitution comprising a hydrophilic support having provided thereon a lipophilic photosensitive resin layer (hereinafter sometimes referred to as "a photosensitive layer") containing a photosensitive compound capable of generating an active species, such as a radical and a Bronsted acid, by laser exposure has so far been proposed and printing plate precursors of these kinds have been now on the market. A negative lithographic printing plate can be obtained by scanning exposing the lithographic printing plate precursor with laser beams on the basis of digital data to generate an active species, causing physical or chemical changes in the photosensitive layer by the action of the active species to make the photosensitive layer insoluble, and then development processing the lithographic printing plate precursor.

As a negative lithographic printing plate precursor, there is known a negative lithographic printing plate precursor comprising a hydrophilic support having provided thereon a photopolymerization type photosensitive layer containing a high speed photopolymerization initiator, an addition polymerizable ethylenically unsaturated compound, and a binder polymer soluble in an alkali developing solution, and, if desired, an oxygen-shielding protective layer (e.g., refer to patent literature 1). Lithographic printing plate precursors of such type have desired printing properties, e.g., excellent in productivity and, further, easy to perform a development process, excellent in resolving power and ink receptivity.

As the binder polymer, alkali developable organic polymers, e.g., a methacrylic acid copolymer, an acrylic acid copolymer, an itaconic acid copolymer, a crotonic acid copolymer, a maleic acid copolymer, and a partially esterified maleic acid copolymer are used (e.g., refer to patent literatures 2 to 9).

In addition, for improving a film coating property, aging stability and press life, it is disclosed to use a polyurethane resin having an allyl group as the binder polymer in a photosensitive layer (e.g., refer to patent literature 10). However, a photosensitive composition capable of high sensitivity recording and satisfying all of storage stability (storage stability before exposure) and a film-forming property has not been obtained yet. Accordingly, as the present state, a negative lithographic printing plate precursor capable of high sensitivity recording with infrared laser beams and excellent in storage stability (storage stability before exposure) and press life has not been obtained yet.

[Patent Literature 1]

JP-A-10-195119 (The term "JP-A" as used herein means an "unexamined published Japanese patent application".)

[Patent Literature 2]

JP-A-59-44615

[Patent Literature 3]

JP-B-54-34327 (The term "JP-B" as used herein means an "examined Japanese patent publication".)

[Patent Literature 4]

JP-B-58-12577

[Patent Literature 5]

JP-B-54-25957

[Patent Literature 6]

JP-A-54-92723

[Patent Literature 7]

JP-A-59-53836

[Patent Literature 8]

JP-A-59-71048

[Patent Literature 9]

JF-A-2002-40652

[Patent Literature 10]

Japanese Patent No. 2712564

SUMMARY OF THE INVENTION

The present invention aims at solving the above problems and achieving the following objects.

Specifically, an object of the present invention is to provide a photosensitive composition having good storage stability (storage stability before exposure) and capable of forming a hardened film with high sensitivity by exposure.

Another object of the present invention is to provide a negative type capable of high sensitive recording with infrared laser beams and excellent in storage stability (storage stability before exposure) and press life.

Other objects of the invention will become apparent from the following description.

The above objects can be achieved by the following means.

Specifically, the photosensitive composition according to the invention comprises:

(A) a polymerizable compound represented by the following formula (I):

$$A—\{O—[(CH(—R^1)CH(—R^2))_m—O]_n—C(=O)—C(—R^3)=CH_2\}_p \quad (I)$$

wherein $R^1$, $R^2$ and $R^3$each represents a hydrogen atom or a methyl group, A represents a polyhydric alcohol residue or a polyhydric phenol residue, m represents an integer of from 1 to 6, n represents an integer of from 1 to 20, and represents an integer of from 1 to 6;

(B) an infrared absorber; and (C) an onium salt.

DETAILED DESCRIPTION OF THE INVENTION

The photosensitive composition according to the invention preferably contains (D) a binder polymer having a crosslinkable group.

Further, the photosensitive composition according to the invention preferably contains a polymerizable compound having a urethane skeleton.

The lithographic printing plate precursor according to the invention comprises a support having provided thereon a photosensitive layer containing the photosensitive composition of the invention and may further have other layers provided according to purposes (e.g., a protective layer, an intermediate layer, a back coat layer and the like). It is preferred for the lithographic printing plate precursor according to the invention to have a protective layer.

The present invention can provide a photosensitive composition having good storage stability (storage stability before exposure) and capable of forming a hardened film with high sensitivity by exposure. The present invention can also provide a negative type lithographic printing plate precursor capable of high sensitivity recording with infrared laser beams and excellent in storage stability (storage stability before exposure) and press life.

The present invention is described in detail below.

Photosensitive Composition:

The photosensitive composition according to the invention comprises:

(A) a polymerizable compound represented by the following formula (I):

$$A—\{O—[(CH(—R^1)CH(—R^2))_m—O]_n—C(=O)—C(—R^3)=CH_2\}_p \quad (I)$$

wherein $R^1$, $R^2$ and $R^3$ each represents a hydrogen atom or a methyl group, A represents a polyhydric alcohol residue or a polyhydric phenol residue, m represents an integer of from 1 to 6, n represents an integer of from to 20, and prepresents an integer of from 1 to 6;

(B) an infrared absorber; and (C) an onium salt.

In a photosensitive composition containing an infrared absorber and a polymerization initiator, the infrared absorber and the polymerization initiator ordinarily agglomerate with the lapse of time.

However, it is believed that the agglomeration of an infrared absorber and a polymerization initiator with the lapse of time is restrained in the photosensitive composition according to the invention by using a polymerizable compound represented by formula (I) containing alkylene oxide in the molecule (the polymerizable compound represented by formula (I)), whereby storage stability (storage stability before exposure) is improved.

It is also believed that the deterioration of a developing property is inhibited and storage stability (storage stability before exposure) is improved in the lithographic printing plate precursor using the photosensitive composition of the invention due to the same reason.

Each component contained in the photosensitive composition of the invention is explained in order.

Polymerizable Composition:

(A) Polymerizable Compound Represented by Formula (I):

It is required of the photosensitive composition in the invention to contain a polymerizable compound represented by formula (I). By containing the polymerizable compound represented by formula (I), the photosensitive composition of the invention exhibits excellent storage stability (storage stability before exposure). The lithographic printing plate precursor of the invention containing the photosensitive composition is also excellent in press life.

The polymerizable compound represented by formula (I) is described in detail below.

$R^1$ represents a hydrogen atom or a methyl group, and preferably a hydrogen atom.

$R^2$ represents a hydrogen atom or a methyl group, and preferably a hydrogen atom.

$R^3$ represents a hydrogen atom or a methyl group, and preferably a hydrogen atom.

As the polyhydric alcohol residue represented by A, e.g., glycerol, 1,4-butanediol, 1,6-hexanediol, 1,9-nonanediol, neopentyl glycol, trimethylolpropane, dimethyloldicyclopentane, cyclohexanediol, xylose, pentaerythritol, dipentaerythritol, and polypropylene glycol are exemplified. As the polyhydric phenol residue represented by A, e.g., 4,4-bisphenol, bisphenol A, hydroquinone, bis(4-hydroxy-phenylmethane), catechol, dihydroxynaphthalene, pyrogallol, and resorcinol are exemplified. Of these compounds, bisphenol A is more preferred.

m represents an integer of from 1 to 6, and preferably an integer of 1.

n represents an integer of from 1 to 20, and preferably an integer of from 2 to 10.

p represents an integer of from 1 to 6, and preferably an integer of from 2 to 6.

As the polymerizable compound represented by formula (I), commercially available products can be used.

The specific examples of the commercially available products include EO-modified or PO-modified bisphenol A diacrylate, e.g., ABE-300, A-BPE-4, A-BPE-20, ABPE-30 and A-BPP-3 (manufactured by SHIN-NAKAMURA CHEMICAL CO., LTD.); EO-modified or PO-modified bisphenol A dimethacrylate, e.g., BPE-200, BPE-500 and BPE-1500 (manufactured by SHIN-NAKAMURA CHEMICAL CO., LTD.); EO-modified bisphenol S diacrylate, e.g., M205 (manufactured by TOAGOSEI CO., LTD.); EO-modified bisphenol F diacrylate, e.g., R-712 (manufactured by NIPPON KAYAKUCO., LTD.); PO-modified trimethylolpropane triacrylate, e.g., M-310 (manufactured by TOAGOSEI CO., LTD.); bis(acryloyloxy neopentyl glycol)adipate, e.g., R-526 (manufactured by NIPPON KAYAKUCO., LTD.); ethoxylated glycerol triacrylate, e.g., A-GLY-3E (manufactured by SHIN-NAKAMURA CHEMICAL Co., LTD.); EO-modified or PO-modified trimethylolpropane triacrylate, e.g., A-TMPT-9EO and A-TMPT-3PO (manufactured by SHIN-NAKAMURA CHEMICAL CO., LTD.); EO-modified or PO-modified bisphenol A diacrylate, e.g., A-B1206PE (manufactured by SHIN-NAKAMURA CHEMICAL CO., LTD.); and ethoxylated cyclohexane diacrylate, e.g., A-CHD-4E (manufactured by SHIN-NAMURA CHEMICAL CO., LTD.).

The addition amount of the polymerizable compound represented by formula (I) to the photosensitive composition is preferably from 50 to 100 wt %, and more preferably from 80 to 100 wt %, based on all the polymerizable compounds contained in the photosensitive composition. Besides the polymerizable compound represented by formula (I), other polymerizable compounds, e.g., polymerizable compound having a urethane skeleton described hereinafter, can be used in combination in the photosensitive composition of the invention.

The specific examples of the polymerizable compounds represented by formula (I) (Compounds (I-1) to (I-9)) are shown below, but the present invention is not limited thereto.

Polymerizable Compound having a Urethane Skeleton:

From the viewpoint of press life, it is preferred for the photosensitive composition according to the present inven- (I-1)

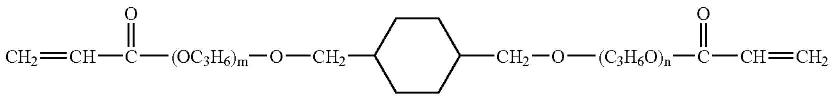

m + n = 4

(I-2)

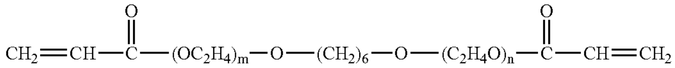

m + n = 2

(I-3)

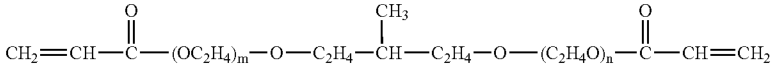

m + n = 4

(I-4)

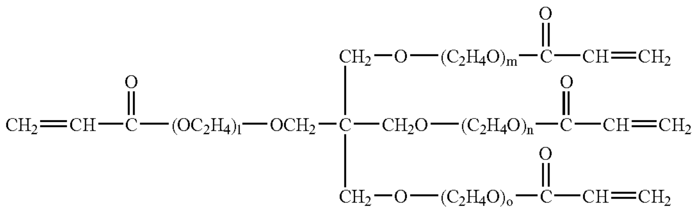

l + m + n + o = 10

(I-5)

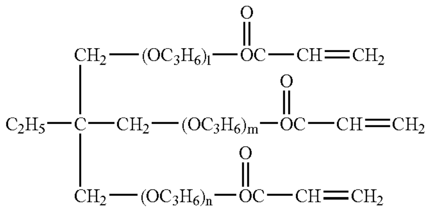

l + m + n = 3

(I-6)

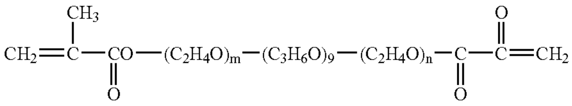

m + n = 5

(I-7)

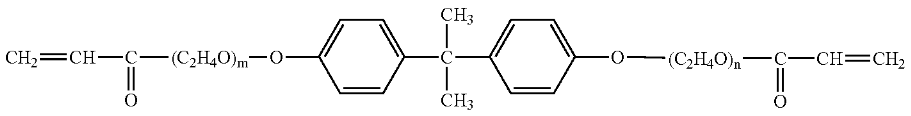

m + n = 4

(I-8)

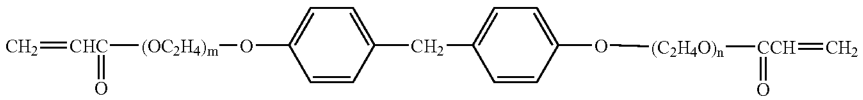

m + n = 4

(I-9)

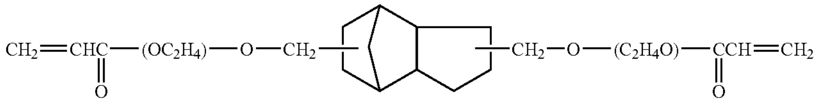

tion to contain a polymerizable compound having a urethane skeleton together with the polymerizable compound represented by formula (I).

The polymerizable compound having a urethane skeleton is an addition polymerizable compound having at least one urethane bond and at least one ethylenically unsaturated double bond in the compound. One urethane bond is sufficient for the polymerizable compound having a urethane skeleton for use in the invention, but a plurality of urethane bonds may be contained. Further, it is preferred to have two or more ethylenically unsaturated bonds, and it is more preferred to have four ethylenically unsaturated bonds (tetrafunctional). The chemical form of the polymerizable compound maybe any of, e.g., a monomer, a prepolymer, i.e., a diner, a trimer, an oligomer, and a mixture and a copolymer thereof.

As the polymerizable compound having a urethane skeleton for Use in the invention, a urethane-based addition polymerizable compound manufactured by the addition reaction of isocyanate and a hydroxyl group is preferred. As the specific example of urethane-based addition polymerizable compound for use in the invention, e.g., a vinyl urethane compound containing two or more polymerizable vinyl groups in a molecule obtained by adding a vinyl monomer having a hydroxyl group represented by the following formula (II) to a polyisocyanate compound having two or more isocyanate groups in a molecule as disclosed in JP-B-48-41708 is exemplified.

$$CH_2{=}C(R^3)COOCH_2CH(R^4)OH \qquad (II)$$

wherein $R^3$ and $R^4$ each represents H or $CH_3$.

Further, urethane acrylates as disclosed in JP-A-51-37193, JP-B-2-32293 and JP-B-2-16765, and urethane compounds having an ethylene oxide-based skeleton as disclosed in JP-B-58-49860, JP-B-56-17654, JP-B-62-39417 and JP-B-62-39418 can also be preferably used as the polymerizable compound having a urethane skeleton. In addition, by using addition polymerizable compounds having an amino structure or a sulfide structure in the molecule as disclosed in JP-A-63-277653, JP-A-63-260909 and JP-A-1-105238, extremely high speed photopolymerizable compositions can be obtained.

In addition to the above compounds, each of the compounds shown below can also be preferably used as the polymerizable compound having a urethane skeleton in the photosensitive composition in the present invention. The examples include urethane acrylate M-1100, M-1200, M-1210 and M-1310 (manufactured by TOAGOSEI CO., LTD,), urethane acrylate EB210, EB4827, ES6700 and EB220 (manufactured by DAICEL UCB CO., LTD.), UVITHANE-782, UVITHANE-783, UVITHANE-788 and UVITHANE-893 (manufactured by MORTON THIOKOL Inc.), Art Resin UN-9000EP, Art Resin UN-9200A, Art Resin UN-9000H, Art Resin UN-1255, Art Resin UN-5000, Art Resin UN-2111A, Art Resin UN-2500, Art Resin UN-3320HA, Art Resin UN-3320HB, Art Resin UN-3320HC, Art Resin UN-3320HS, Art Resin UN-6060P, Art Resin UN-6060PTM, Art Resin SH-380G, Art Resin SH-500, and Art Resin SH-9832 (manufactured by Negami Chemical Industrial Co., Ltd.), NK Oligo U-4H, NK Oligo U-4HA, NK Oligo U-4P, NK Oligo U-4PA, NK Oligo U-4TX, NK Oligo U-4TXA, NK Oligo U-6LHA, NK Oligo U-6LPA-N, NK Oligo U-6LTXA, NK Oligo UA-6ELP, NK Oligo UA-6ELH, NK Oligo UA-6ELTX, NK Oligo UA-6PLP, NK Oligo U-6ELP, NK Oligo U-6ELH, NK Oligo U-8MDA, NK Oligo U-8MD, NK Oligo U-12IMA, NK Oligo U-12LM, NK Oligo U-6HA, NK Oligo U-108A, NK Oligo U-1084A, NK Oligo U-200AX, NK Oligo U-122A, NK Oligo U-340A, NK Oligo U-324A, and NK Oligo UA-100 (manufactured by SHIN-NAKAMURA CHEMICAL CO., LTD.), and AH-600, AT-600, UA-306H, AT-600, UA-101T, UA-101I, UA-101H, UA-306T, UA-306I, UF-8001and UF-8003 (manufactured by KYOEISHA CHEMICAL CO., LTD.).

The specific examples of the polymerizable compound having a urethane skeleton that are preferably used in the invention are shown below (Compounds M-1 to M-22), but the present invention is not limited to these compounds.

M-1

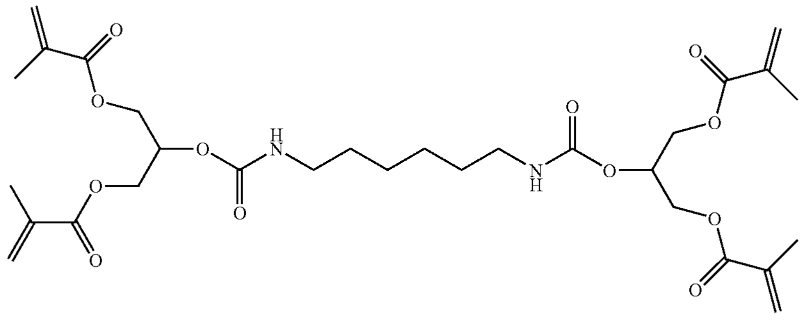

-continued
M-2
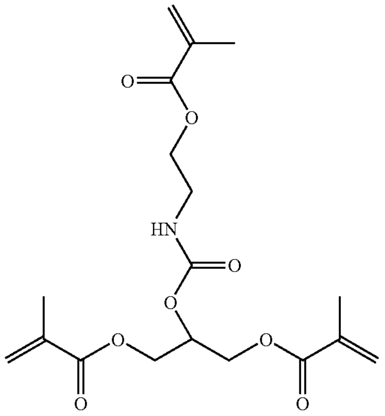
M-3
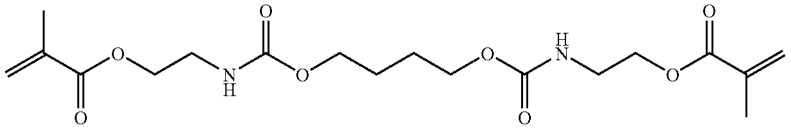
M-4
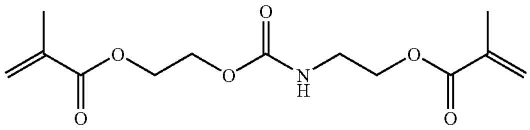
M-5
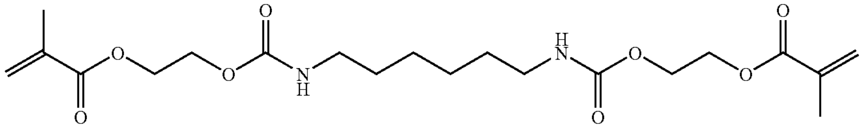
M-6
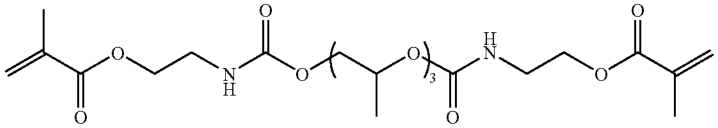
M-7
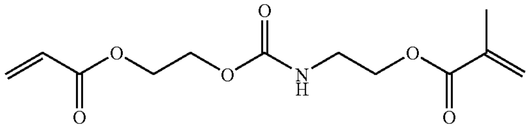
M-8
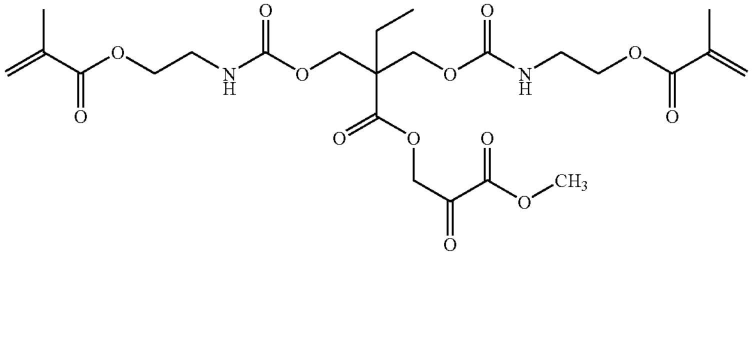

-continued
M-9
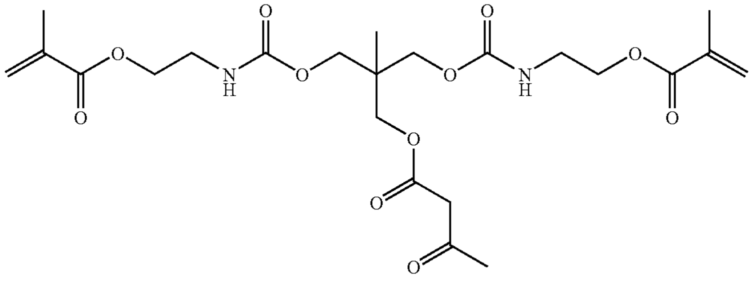
M-10
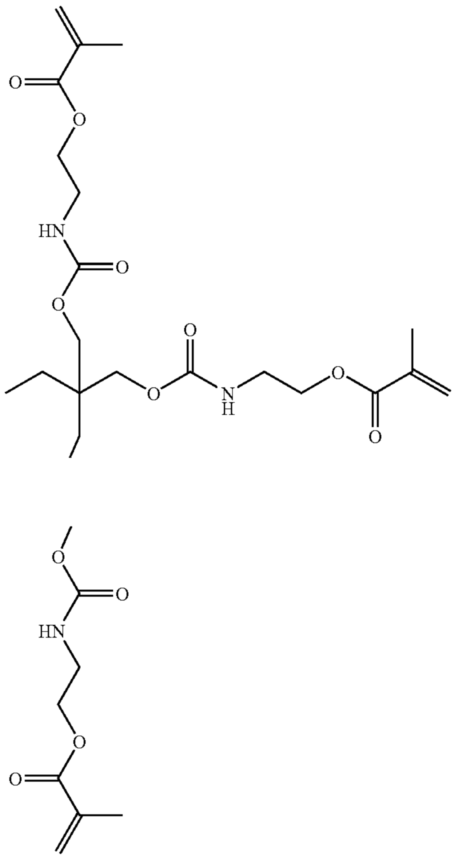
M-11
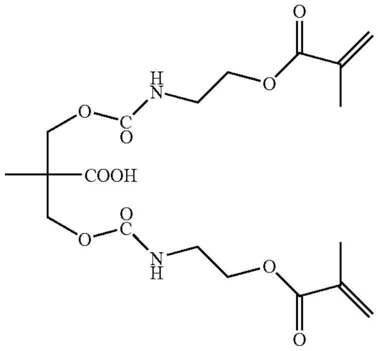
M-12
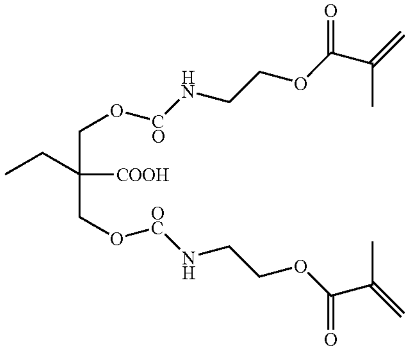

-continued
M-13
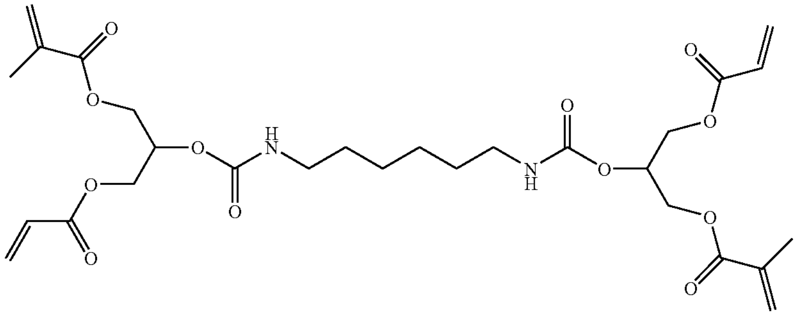
M-14
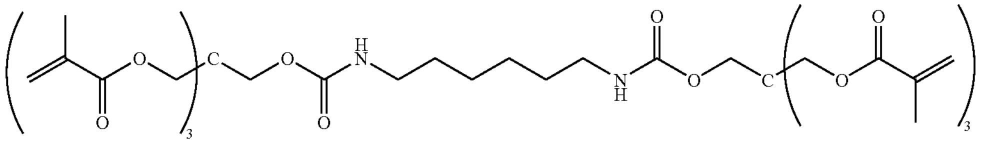
M-15
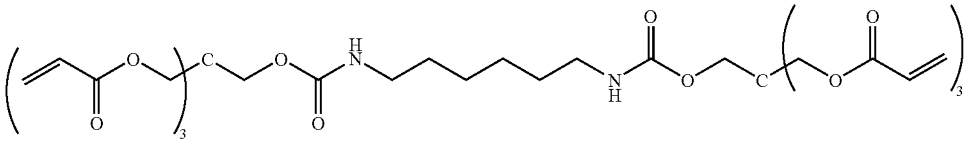
M-16
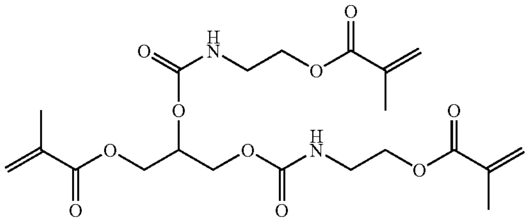
M-17
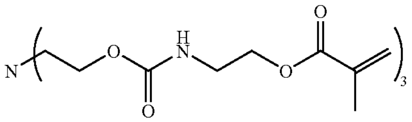
M-18
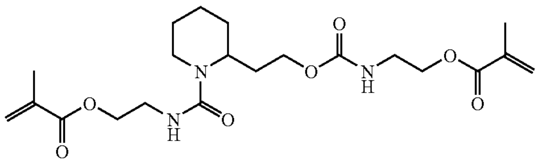
M-19
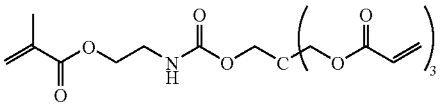
M-20
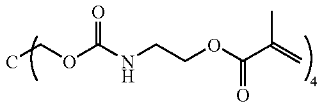
M-21
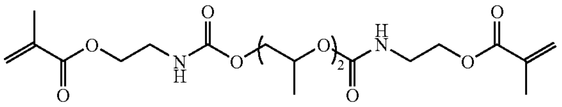
M-22
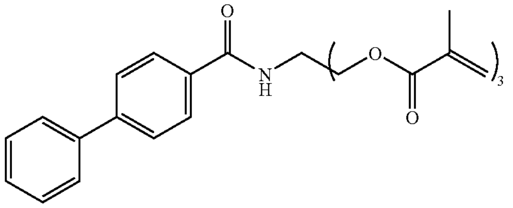

The addition amount of the polymerizable compound having a urethane skeleton is preferably from 2 to 50 wt %, and more preferably from 5 to 20 wt %, based on all the polymerizable compounds contained in the photosensitive composition. The polymerizable compounds having a urethane skeleton may be used alone or in combination of two or more thereof.

Concerning the blending ratio of a polymerizable compound in a photosensitive composition, the more the amount, the higher is the sensitivity, but too large an amount sometimes results in disadvantageous phase separation, problems in a manufacturing process due to the stickiness of a photosensitive layer when the photosensitive composition is used in a lithographic printing plate precursor (e.g., manufacturing failure resulting from the transfer and stickiness of the photosensitive layer components), and the precipitation in a developing solution is liable to occur.

From these points of view, the total blending amount of the polymerizable compounds (the amounts of the polymerizable compound represented by formula (I), the polymerizable compound having a urethane skeleton, and other polymerizable compounds usable in combination described hereinafter) is preferably from 5 to 80 wt %, and more preferably from 25 to 75 wt %, based on the non-volatile components in the composition.

Further, the ratio (weight ratio) of the polymerizable compound represented by formula (I) to the polymerizable compound having a urethane skeleton is preferably from 50/50 to 100/0, and more preferably from 75/25 to 95/5.

Other Polymerizable Compounds Usable in Combination:

Besides the polymerizable compound represented by formula (I) and the polymerizable compound having a urethane skeleton, other polymerizable compounds can be used in the present invention in the range of not impairing the effects of the present invention.

In the present invention, other polymerizable compounds usable in combination with the polymerizable compound represented by formula (I) and the polymerizable compound having a urethane skeleton are addition polymerizable compounds having at least one ethylenically unsaturated double bond, and they are selected from the compounds having at least one ethylenically unsaturated bond, preferably two or more ethylenically unsaturated bonds.

These compounds are well known in the field of art, and they can be used with no particular limitation. These other polymerizable compounds have chemical forms of, e.g., a monomer, a prepolymer, i.e., a dimer, a trimer, an oligomer, and a mixture and a copolymer thereof. As the examples of monomers and the copolymers thereof, unsaturated carboxylic acids (e.g., acrylic acid, methacrylic acid, itaconic acid, crotonic acid, isocrotonic acid, maleic acid, etc.), and esters and-amides of these unsaturated carboxylic acids are exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of esters and amides of unsaturated carboxylic acids having a nucleophilic substituent such as a hydroxyl group, an amino group or a mercapto group with monofunctional or polyfunctional isocyanates or epoxies, and the dehydration condensation reaction products with monofunctional or polyfunctional carboxylic acids are also preferably used. Further, the addition reaction products of unsaturated carboxylic esters or amides having an electrophilic substituent such as an isocyanate group or an epoxy group with monofunctional or polyfunctional alcohols, amines or thiols, and the substitution reaction products of unsaturated carboxylic esters or amides having a separable substituent such as a halogen group or a tosyloxy group with monofunctional or polyfunctional alcohols, amines or thiols are also preferably used. As another example, it is also possible to use compounds in which the unsaturated carboxylic acid is replaced with unsaturated phosphonic acid, styrene, vinyl ether, etc.

The specific examples of monomers of the esters of aliphatic polyhydric alcohol compounds and unsaturated carboxylic acids include, as acrylates, ethylene glycol diacrylate, 1,3-butanediol diacrylate, propylene glycol diacrylate, neopentyl glycol diacrylate, trimethylolpropane triacrylate, trimethylolpropanetri(acryloyloxypropyl) ether, trimethylolethane triacrylate, hexanediol diacrylate, 1,4-cyclohexanediol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, the examples include neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane, bis[p-(methacryloxy-ethoxy)phenyl] dimethylmethane, etc.

As itaconates, the examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, the examples include ethylene glycol dicrotonate, tetramethylene glycol dicrotonate, pentaerythritol dicrotonate, sorbitol tetradicrotonate, etc.

As isocrotonates, the examples include ethylene glycol diisocrotonate, pentaerythritol diisocrotonate, sorbitol tetraisocrotonate, etc.

As maleates, the examples include ethylene glycol dimaleate, triethylene glycol dimaleate, pentaerythritol dimaleate, sorbitol tetramaleate, etc.

As the examples of other esters, e.g., the aliphatic alcohol-based esters disclosed in JP-B-46-27926, JP-B-51-47334 and JP-A-57-196231, the esters having an aromatic skeleton disclosed in JP-A-59-5240, JP-A-59-5241 and JP-A-2-226149, and the esters containing an amino group disclosed in JP-A-1-165613 are also preferably used in the present invention. Further, the above ester monomers can also be used as mixtures.

Further, the specific examples of the amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriamintris-acrylamide, xylylenebis-acrylamide, xylylenebis-methacrylamide, etc. As other preferred amide monomers, those having a cyclohexylene structure disclosed in JP-B-54-21726 can be exemplified.

As other examples, the polyfunctional acrylates and methacrylates, suchaspolyesteracrylates, and epoxyacrylates obtained by reacting epoxy resins with (meth) acrylic acids as disclosed in JP-A-48-64183, JP-B-49-43191 and JP-B-

52-30490 can be exemplified. The specific unsaturated compounds disclosed in JP-B-46-43946, JP-B-1-40337 and JP-8-1-40336, and the vinyl sulfonic acid compounds disclosed in JP-A-2-25493 can also be exemplified. Further, according to cases, the structures containing a perfluoroalkyl group disclosed in JP-A-61-22048 are preferably used. Moreover, the photo-curable monomers and oligomers described in *Bulletin of Nippon Setchaku Kyokai*, Vol. 20, No. 7, pp. 300-308 (1984) can also be used.

The details in usage of the polymerizable compound in the invention, e.g., what structure is to be used, whether the compound is to be used alone or in combination, or what an amount is to be used, can be optionally set up according to the final design of the performances of the photosensitive composition.

For example, the conditions are selected from the viewpoint as follows. As for the photosensitive speed, the structure containing many unsaturated groups per molecule is preferred and bifunctional or higher functional groups are preferred in many cases. For increasing the strength of an image part, i.e., a hardened film, trifunctional or higher functional groups are preferred, and it is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but they are in some cases not preferred in the point of development speed and precipitation in a developing solution. Further, the selection and usage of the addition polymerizable compound are important factors for the compatibility with other components (e.g., a binder polymer, an initiator, a colorant, etc.) in the composition and dispersibility, for example, sometimes compatibility can be improved by using a low purity compound or two or more compounds in combination. Further, when the photosensitive composition is used in a lithographic printing plate precursor, it is also possible to select a compound having a specific structure for the purpose of improving the adhesion property to a support and an overcoat layer described later.

In addition, the appropriate structures, blending ratios and addition amounts of polymerizable compounds to be used can be arbitrarily selected from the light of the degree of polymerization hindrance due to oxygen, resolution, a fogging property, refractive index change and surface stickiness. Further, when the photosensitive composition is used in a lithographic printing plate precursor, a layer construction such as an undercoat layer and an overcoat layer and a coating method may be also be appropriately selected.

(B) Infrared Absorber:

It is essential to use an infrared absorber in the photosensitive composition in the present invention. The infrared absorber has a function of converting the absorbed infrared rays to heat. A radical is generated by the thermal decomposition of a polymerization initiator (a radical generator) described later by the heat generated at this time. The infrared absorbers used in the invention are preferably dyes or pigments having an absorption maximum between the wavelengths of from 760 to 1,200 nm.

As dyes for this purpose, commercially available dyes and well-known dyes described in literatures, e.g., in *Senryo Binran* (*Dye Handbook*), compiled by Yuki Gosei Kagaku Kyokai (1970) can be used. Specifically, azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes are exemplified.

As preferred dyes, e.g., the cyanine dyes disclosed in JP-A-58-125246, JP-A-59-84356, JP-A-59-202829 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, and the cyanine dyes disclosed in British Patent 434,875 are exemplified.

Further, the near infrared-absorbing sensitizers disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethine thiopyrylium salt disclosed in U.S. Pat. No. 4,283,475, and the pyrylium compounds disclosed in JP-B-5-13514 and JP-B-5-19702 are also preferably used in the present invention. As other examples of preferred dyes, the near infrared-absorbing dyes disclosed in U.S. Pat. No. 4, 756,993 as the compounds represented by formulae (I) and (II) can be exemplified.

As other examples of preferred infrared-absorbing dyes in the invention, the specific indolenine cyanine dyes disclosed in JP-A-2002-278057.

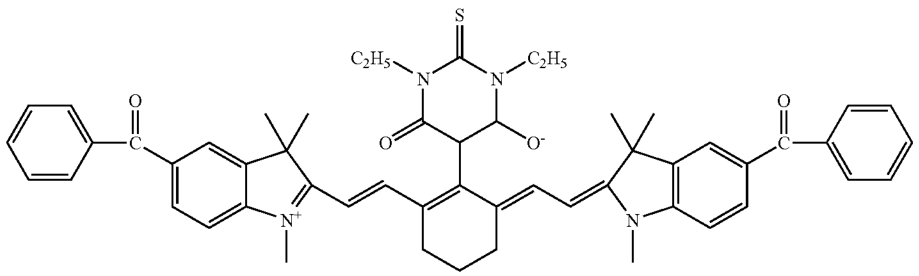

-continued

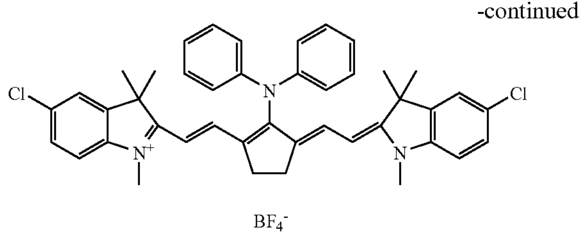

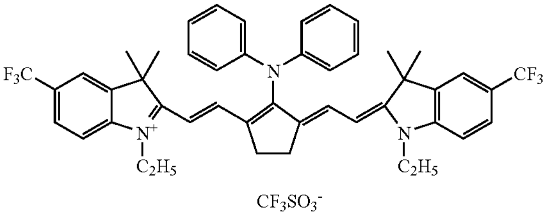

Of these dyes, a cyanine dye, a squarylium dye, apyrylium salt, a nickel thiolate complex and an indolenine cyanine dye are especially preferred. A cyanine dye and an indolenine cyanine dye are more preferred, and a cyanine dye represented by the following formula (a) is particularly preferred.

(a)

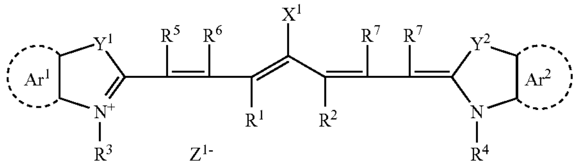

wherein $X^1$ represents a hydrogen atom, a halogen atom, $—NPh_2$, $X^2$-$L^1$, or a group shown below; $X^2$ represents an oxygen atom, anitrogen atom or a sulfur atom; and L1 represents a hydrocarbon group having from 1 to 12 carbon atoms, an aromatic ring having a hetero atom, or a hydrocarbon group containing a hetero atom and having from 1 to 12 carbon atoms. The hetero atom used herein means N, S, O, a halogen atom or Se. $X_a^-$ has the same meaning as $Z^{1-}$ defined hereinafter, and $R^a$ represents a hydrogen atom, an alkyl group, an aryl group, a substituted or unsubstituted amino group or a halogen atom.

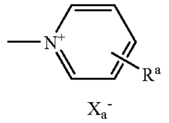

$R^1$ and $R^2$ each represents a hydrocarbon group having from 1 to 12 carbon atoms. In view of the storage stability of a photosensitive layer-forming coating solution, $R^1$ and $R^2$ each preferably represents a hydrocarbon group having 2 or more carbon atoms, and particularly preferably $R^1$ and $R^2$ are bonded to each other to form a 5- or 6-membered ring.

$Ar^1$ and $Ar^2$, which may be the same or different, each represents an aromatic hydrocarbon group which may have a substituent. Preferred examples of the aromatic hydrocarbon group include a benzene ring and a naphthalene ring. Preferred examples of the substituent for the aromatic hydrocarbon group include a hydrocarbon group having 12 or less carbon atoms, a halogen atom, and an alkoxyl group having 12 or less carbon atoms. $Y^1$ and $Y^2$, which may be the same or different, each represents a sulfur atom or a dialkylmethylene group having 12 or less carbon atoms. R3 and R4, which may be the same or different, each represents a hydrocarbon group having 20 or less carbon atoms which may have a substituent. Preferred examples of the substituent for the hydrocarbon group include an alkoxyl group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, preferably a hydrogen atom because of easy availability of raw material. $Z^{1-}$ represents a counter anion, provided that when a cyanine dye represented by formula (a) has an anionic substituent in its structure and the neutralization of the electric charge is not necessary, $Z^{1-}$ is not necessary. $Z^{1-}$ preferably represents a halogen ion, a perchlorate ion, a tetrafluoroborate ion, a hexafluorophosphate ion or a sulfonate ion, and particularly preferably, a perchlorate ion, a hexafluorophosphate ion or an arylsulfonate ion.

As specific examples of the cyanine dye represented by formula (a) that can be preferably used in the invention, those disclosed in JP-A-2001-133969, paragraphs [0017] to [0019] can be exemplified.

Further, as particularly preferred other examples, the indolenine cyanine dyes disclosed in JP-A-2002-278057 are exemplified.

As the pigments used in the present invention, commercially available pigments and the pigments described in *Colour Index* (*C.I.*), *Shaishin Ganryo Binran* (*The Latest Pigment Handbook*), compiled by Nippon Ganryo Gijutsu Kyokai (1977), *Shaishin Ganryo Oyo Gijutsu* (*The Latest Pigment Applied Techniques*), CMC Publishing Co. Ltd. (1986), *Insatsu Ink Gijutsu* (*Printing Ink Techniques*), CMC Publishing Co. Ltd. (1984) can be used.

Various kinds of pigments can be used in the invention, e.g., black pigments, yellow pigments, orange pigments, brown pigments, red pigments, purple pigments, blue pigments, green pigments, fluorescent pigments, metallic powder pigments, and polymer-bond pigments can be exemplified. Specifically, insoluble azo pigments, azo lake pigments, condensation azo pigments, chelate azo pigments, phthalocyanine pigments, anthraquinone pigments, perylene and perinone pigments, thioindigopigments, quinacridone pigments, dioxazine pigments, isoindolinone pigments, quinophthalone pigments, dye lake pigments, azine pigments, nitroso pigments, nitro pigments, natural pigments, fluorescent pigments, inorganic pigments, and carbon black can be used. Of these pigments, carbon black is preferably used.

The pigments can be used without surface treatment or may be surface-treated. As methods of the surface treatment, a method of coating the surfaces of pigments with resins or waxes, a method of adhering surfactants, and a method of bonding reactive substances (e.g., silane coupling agents, epoxy compounds, or polyisocyanate) on the surfaces of pigments can be exemplified. The surface treatment methods are described in *Kinzoku Sekken no Seishitsu to Oyo* (*Natures and Applications of Metal Soaps*), Saiwai Shobo Co., Ltd., *Insatsu Ink Gijutsu* (*Printing Ink Techniques*), CMC Publishing Co., Ltd. (1984), and *Shaishin Ganryo Oyo Gijutsu* (*The Latest Pigment Applied Techniques*), CMC Publishing Co., Ltd. (1986).

The particle size of pigments is preferably from 0.01 to 10 μm, more preferably from 0.05 to 1 μm, and still more preferably from 0.1 to 1 μm, in view of dispersion stability of pigments and film-forming property.

Well-know dispersing methods used in the manufacture of inks and toners can be used as the dispersing methods of pigments. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill and a pressure kneader, and details are described in *Shaishin Ganryo Oyo Gijutsu* (*The Latest Pigment Applied Techniques*), CMC Publishing Co., Ltd. (1986).

When the photosensitive composition of the invention is used in a lithographic printing plate precursor, the infrared absorber may be added to the same layer containing other components, or may be added to an independent different layer. However, when a negative lithographic printing plate precursor is manufactured, the infrared absorber is added so that the absorbance of the photosensitive layer at the maximum absorption wavelength in the range of the wavelength of from 760 to 1,200 nm is from 0.5 to 1.2, and preferably from 0.6 to 1.15, by a reflection measuring method.

When the absorbance is in the range of from 0.5 to 1.2, the strength of the image area and the adhesion between a support and the photopolymerizable layer are improved, whereby sufficient number of printing sheets at printing can be ensured.

The absorbance of the photosensitive layer can be adjusted by an amount of the infrared absorber to be added to the photosensitive layer and the photosensitive layer thickness. Absorbance can be measured by ordinary methods. As the measuring methods of absorbance, e.g., a method of forming a photosensitive layer having an appropriate layer thickness of a dry coating amount necessary as a lithographic printing plate on a reflective support, such as aluminum, and measuring the reflection density with an optical densitometer, and a method of measuring absorbance by a reflecting method using an integrating sphere with a spectrophotometer are exemplified.

The total amount of infrared absorber to be added to the photosensitive composition of the invention is preferably from 0.1 to 40 wt %, more preferably from 0.5 to 30 mass %, and particularly preferably from 1 to 10 mass %, based on the total solid content of the photosensitive composition.

(C) Onium Salt:

As a polymerization initiator to initiate and advance a curing reaction of the polymerizable compound, the photosensitive composition of the invention contains an onium salt that is a heat-decomposable type radical generator capable of being decomposed by heat to generate a radical. In the invention, the onium salt functions as a radical polymerization initiator not as an acid generator. By using the onium salt in combination with the above-described infrared absorber, the infrared absorber generates heat by irradiation with infrared laser beams and the onium salt generates a radical by the heat. By the combination of the onium salt and the infrared absorber, high sensitivity heat mode recording becomes possible according to the invention.

As the onium salt preferably used in the invention, a sulfonium salt, an iodonium salt and a diazonium salt are exemplified of these onium salts, a sulfonium salt is more preferably used in the invention.

In the case of using a sulfonium salt, when the photosensitive composition according to the invention is used in the photosensitive layer of a lithographic printing plate precursor described hereinafter, a radical polymerization reaction effectively proceeds and strength of the image area formed becomes very high due to the high sensitivity sulfonium salt polymerization initiator contained in the photosensitive composition. When a lithographic printing plate precursor has a protective layer on the photosensitive layer, conjointly with an oxygen-shielding function of the protective layer, a lithographic printing plate having an image area of high strength can be obtained, which results in the improvement of press life. Further, since the sulfonium salt polymerization initiator itself is excellent in aging stability, the occurrence of undesired polymerization reaction can be restrained even when the lithographic printing plate precursor is preserved after the production.

The onium salt preferably used in the invention is described below.

An onium salt represented by the following formula (1) is preferably used in the invention.

(1)

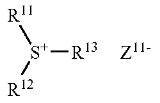

In formula (1), $R^{11}$, $R^{12}$ and $R^{13}$, which may be the same or different, each represents a hydrocarbon group having 20 or less carbon atoms which may have a substituent. Preferred examples of the substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of a halogen ion, a perchlorate ion, a tetrafluoroborate ion, a hexafluorophosphate ion, a carboxylate ion, and a sulfonate ion, and preferably a perchlorate ion, a hexafluorophosphate ion, a carboxylate ion or an arylsulfonate ion.

Specific examples of the onium salt represented by formula (1) (Compounds [OS-1] to [OS-10]) are shown below, but the present invention is not limited to these examples.

[OS-1]

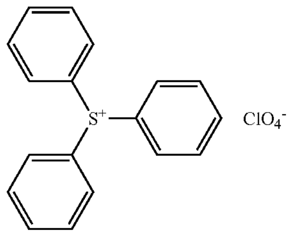

-continued
[OS-2]
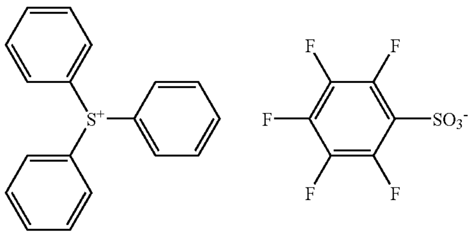
[OS-3]
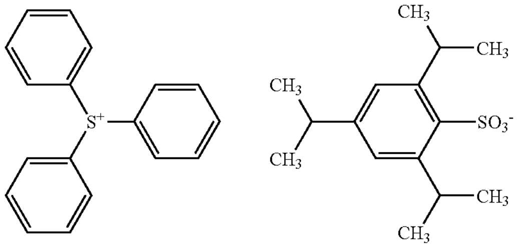
[OS-4]
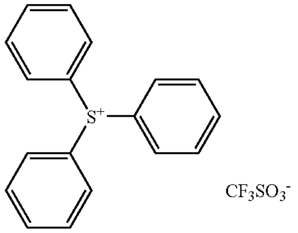
[OS-5]
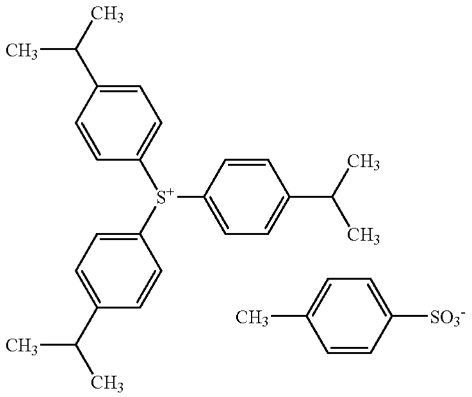
[OS-6]
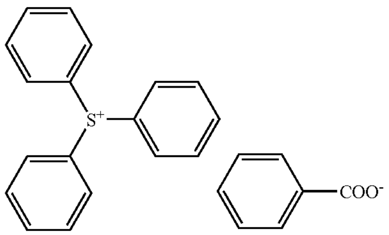
-continued
[OS-7]
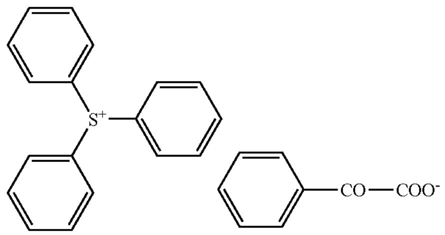
[OS-8]
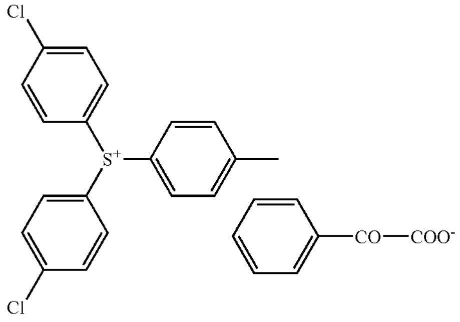
[OS-9]
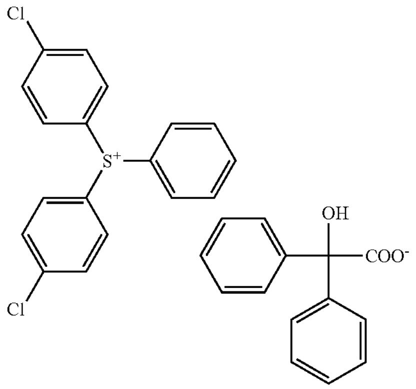
[OS-10]
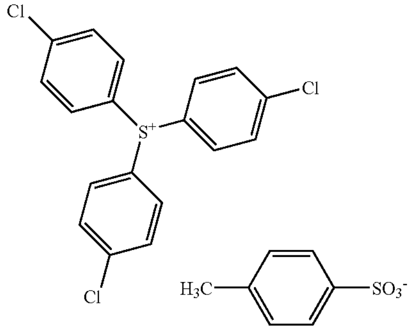
In addition to those described above, specific aromatic sulfonium salts disclosed in JP-A-2002-148790, JP-A-2002-350207 and JP-A-2002-6482 are also preferably used.
As the onium salt for use in the invention, onium salts represented by the following formulae (2) and (3) are also preferably used.
$$Ar^{21}—I^{+}—Ar^{22}Z^{21-} \quad (2)$$
$$Ar^{31}—N^{+}\equiv N\ Z^{31-} \quad (3)$$

In formula (2), $Ar^{21}$ and $Ar^{22}$ each represents an aryl group having 20 or less carbon atoms which may have a substituent. Preferred examples of the substituent for the aryl group include a halogen atom, a nitro group, an alkyl group having 12 or less carbon atoms, an alkoxy group having 12 or less carbon atoms, and an aryloxy group having 12 or less carbon atoms. $Z^{21-}$ represents a counter ion having the same meaning as $Z^{11-}$.

In formula (3), $Ar^{31}$ represents an aryl group having 20 or less carbon atoms which may have a substituent. Preferred examples of the substituents for the aryl group include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{31-}$ represents a counter ion having the same meaning as $Z^{11-}$.

Specific examples of the onium salt represented by formula (2) (Compounds [IO-1] to [IO-10]) and the onium salt represented by formula (3) (Compounds [ON-1] to [ON-5]) that can be preferably used in the invention are shown below, but the present invention is not limited to these examples.

[OI-1]

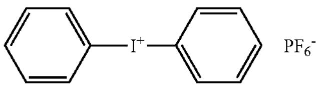

[OI-2]

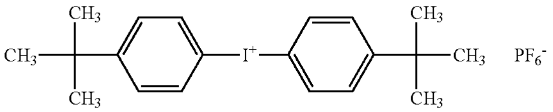

[OI-3]

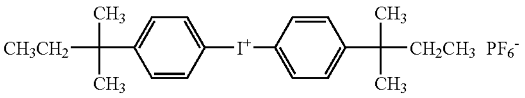

[OI-4]

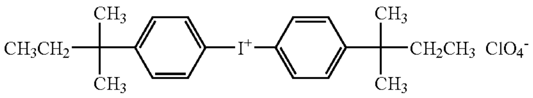

[OI-5]

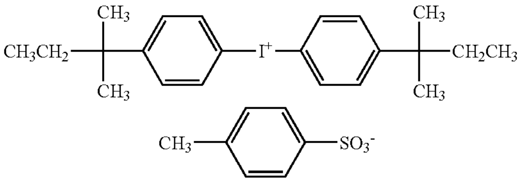

[OI-6]

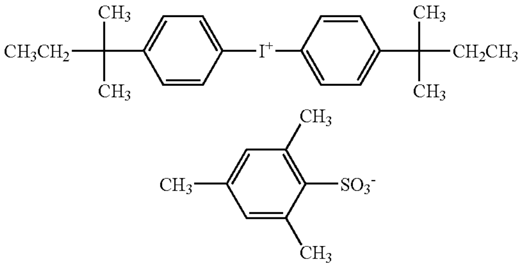

[OI-7]

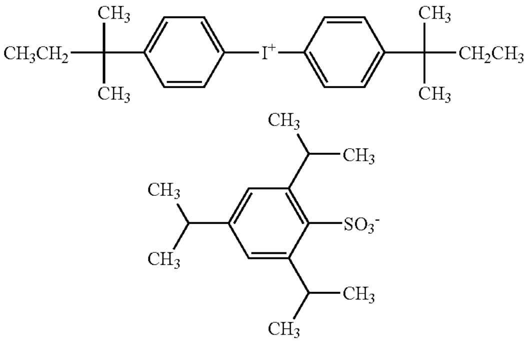

[OI-8]

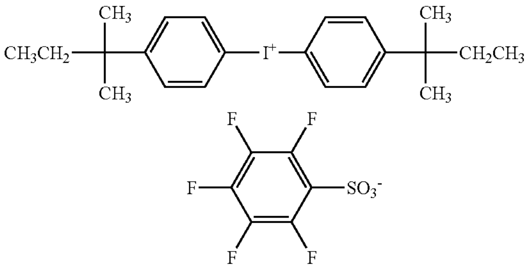

[OI-9]

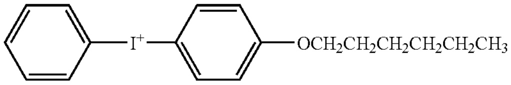

[OI-10]

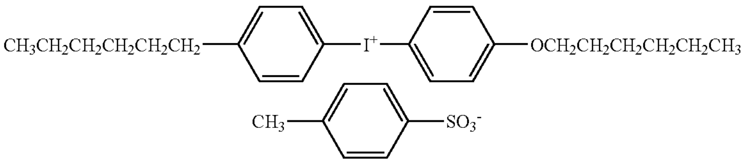

-continued

[ON-1]

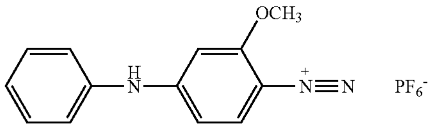

[ON-2]

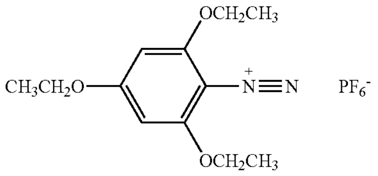

[ON-3]

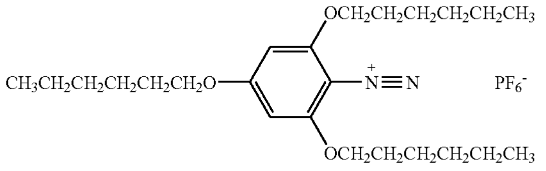

[ON-4]

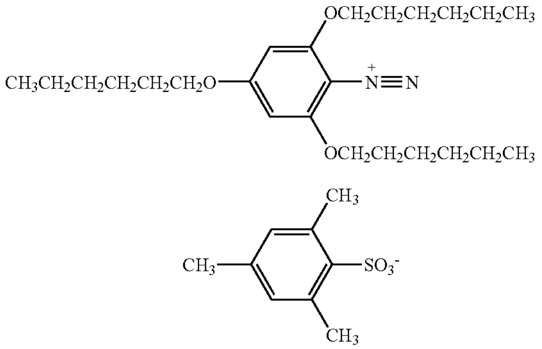

[ON-5]

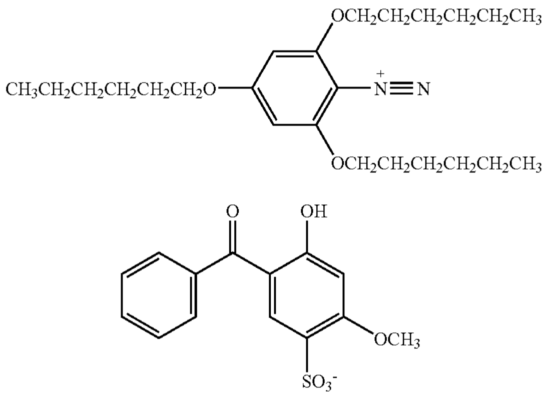

As specific examples of the onium salt that can be preferably used in the invention, onium salts disclosed in JP-A-2001-133696 are exemplified.

It is preferred that the maximum absorption wavelength of the onium salt (radical generator) for use in the invention is 400 nm or less, and more preferably 360 nm or less. By making the absorption wavelength in an ultraviolet region, the photosensitive composition of the invention can be handled under white light when it is applied to a lithographic printing plate precursor.

The total amount of onium salt in the photosensitive composition of the invention is from 0.1 to 50 wt %, preferably from 0.5 to 30 wt %, and particularly preferably from 1 to 20 wt %, based on the total solid content of the photosensitive composition.

In the above range, good sensitivity can be ensured, and the occurrence of stain in the non-image area in printing can be restrained when the photosensitive composition is used in a lithographic printing plate precursor.

The onium salts may be used alone or in combination of two or more thereof in the invention when two or more onium salts are used in combination, a plurality of the same kinds of onium salts (e.g., sulfonium salts alone) maybe used together, or a plurality of different kinds of onium salts may be used in combination.

In the present invention, besides the onium salt contained as the essential component, other polymerization initiator (other radical generator) may be used in combination.

As other polymerization initiators, triazine compounds having a trihalomethyl group, peroxides, azo-based polymerization initiators, azide compounds, quinonediazide, oxime ester compounds and triarylmonoalkyl borate compounds are exemplified.

When the onium salt is used in combination with other polymerization initiator, the ratio (weight ratio) thereof is preferably from 100/1 to 100/50, and more preferably from 100/5 to 100/25.

Further, when the photosensitive composition of the invention is applied to a lithographic printing plate precursor, the polymerization initiator such as the onium salt may be added together with other components to the same layer or, the onium salt may be added to an independent different layer.

(D) Binder Polymer having a Crosslinkable Group:

It is preferred for the photosensitive composition of the invention to further contain a binder polymer having a crosslinkable group (hereinafter sometimes referred to as a "specific binder polymer") in view of improvement in a layer property.

As the specific binder polymer, binder polymers containing a structural unit having a radical polymerizable group are preferred.

The radical polymerizable group is not especially restricted so long as it can be polymerized by radical, but an α-substituted methylacryl group [—OC(═O)—C(—$CH_2Z$)═$CH_2$, wherein Z represents a hydrocarbon group connecting through a hetero atom], an acryl group, a methacryl group, an allyl group and a styryl group are exemplified. Of these groups, an acryl group and a methacryl group are preferred.

The amount of a radical polymerizable group contained in the specific binder polymer (amount of radical polymerizable unsaturated double bond according to an iodometric titration method) is preferably from 0.1 to 10.0 mmol, more preferably from 1.0 to 7.0 mmol, and most preferably from 2.0 to 5.5 mmol, per gram of the binder polymer, from the viewpoint of the compatibility of sensitivity and preservability.

It is also preferred for the specific binder polymer to further contain a structural unit having an alkali-soluble group in addition to the structural unit having the radical polymerizable group.

A structural unit containing at least one alkali-soluble group selected from the group consisting of the following (1) to (6) is preferred from the point of solubility of the specific binder polymer in an alkali developing solution.

(1) A phenolic hydroxyl group (—Ar—OH)

(2) A sulfonamido group (—$SO_2NH$—R)

(3) A substituted sulfonamido-based acid group (hereinafter also referred to as an "active imido group") (—$SO_2NHCOR$, —$SO_2NHSO_2R$, —$CONHSO_2R$)

(4) A carboxylic acid group (—$CO_2H$)

(5) A sulfonic acid group (—$SO_3H$)

(6) A phosphoric acid group (—$OPO_3H_2$)

In the above (1) to (6), Ar represents a divalent aryl linking group which may have a substituent, and R represents a hydrogen atom or a hydrocarbon group which may have a substituent.

It is not necessary for the structural unit having the alkali-soluble group selected from the above (1) to (6) to be one kind, and two or more structural units having the same alkali-soluble group or two or more structural units having different alkali-soluble groups may be copolymerized.

The amount of an alkali soluble group contained in the specific binder polymer (an acid value according to a neutralization titration method) is preferably from 0.1 to 3.0 mmol, more preferably from 0.2 to 2.0 mmol, and most preferably from 0.45 to 1.0 mmol, per gram of the binder polymer, from the viewpoint of prevention from the occurrence of development scum and press life.

To introduce the alkali-soluble group into the specific binder polymer, a mode that the polymer contains a structural unit represented by the following formula (i) is most preferred

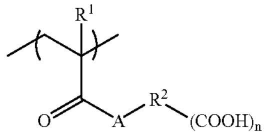

(i)

wherein $R^1$ represents a hydrogen atom or a methyl group, $R^2$ represents a linking group comprising one or more atoms selected from the group consisting of a carbon atom, a hydrogen atom, an oxygen atom, a nitrogen atom and a sulfur atom, A represents an oxygen atom or —$NR^3$—, $R^3$ represents a hydrogen atom or a monovalent hydrocarbon group having from 1 to 10 carbon atoms, and n represents an integer of from 1 to 5.

$R^1$ in formula (i) represents a hydrogen atom or a methyl group, and particularly preferably a methyl group.

The linking group represented by $R^2$ in formula (i) is preferably a linking group comprising one or more atoms selected from the group consisting of a carbon atom, a hydrogen atom, an oxygen atom, anitrogen atom and a sulfur atom, and the number of atoms excepting a substituent is preferably from 2 to 82. The number of atoms constituting the main skeleton of $R^2$ is preferably from 1 to 30, more preferably from 3 to 25, still more preferably from 4 to 20, and most preferably from 5 to 10. The number of atoms constituting the main skeleton of $R^2$ means the number of atoms connecting A and the terminal COOH by the shortest course. Specifically, alkylene, substituted alkylene, arylene and substituted arylene are exemplified, and a plurality of these divalent groups may be bonded through an amido bond and an ester bond.

As a linking group having a chain structure, ethylene and propylene are exemplified. A structure that alkylenes are bonded through an ester bond is also preferred.

The linking group represented by $R^2$ in formula (i) is preferably an (n+1)-valent hydrocarbon group having an alicyclic structure having from 3 to 30 carbon atoms. More specifically, an (n+1)-valent hydrocarbon group obtained by removing (n+1) number hydrogen atoms on arbitrary carbon atoms constituting a compound having the alicyclic structure, e.g., cyclopropane, cyclopentane, cyclohexane, cycloheptane, cyclooctane, cyclodecane, dicyclohexyl, tricyclohexyl and norbornane, which may be substituted with one or more substituents, can be exemplified. It is also preferred that the carbon atom number including the carbon atoms of the substituent(s) of $R^2$ be from 3 to 30.

The carbon atoms constituting the compound having an alicyclic structure may be substituted with one or more hetero atoms selected from a nitrogen atom, an oxygen atom and a sulfur atom. From the point of press life, it is preferred that $R^2$ represent an (n+1) -valent hydrocarbon group having an alicyclic structure, which may have a substituent, having from 5 to 30 carbon atoms containing two or more rings, e.g., condensed polycyclicaliphatic hydrocarbon, crosslinked cyclicaliphatic hydrocarbon, spiro aliphatic hydrocarbon, a set of aliphatic hydrocarbon rings (a set comprising a plurality of rings linked with bonds or linking groups) and the like. In this case, the carbon atom number is also the number including the carbon atom number of the substituent.

The linking group represented by $R^2$ more preferably has from 5 to 10 carbon atoms, and a cyclic structure having ester bonds in the structure and those having a cyclic structure as described above are preferred.

As the substituent that can be introduced into the linking group represented by $R^2$, monovalent non-metallic atomic groups exclusive of a hydrogen atom are exemplified. Examples of the substituent include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkyl-acylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-aryl-ureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group thereof, an alkoxycarbonyl group, an aryloxycarbonyl group, a carbamoyl group, an N-alkylcarbamoyl group, an N,N-dialkyl-carbamoyl group, an N-arylcarbamoyl group, an N,N-diaryl-carbamoyl group, an N-alkyl-N-arylcarbamoyl group, an alkyl-sulfinyl group, an arylsulfinyl group, an alkylsulfonyl group, an arylsulfonyl group, a sulfo group ($—SO_3H$) and a conjugate base group thereof, an alkoxysulfonyl group, an aryloxy-sulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-aryl-sulfinamoyl group, a sulfamoyl group, an N-alkylsulfamoyl group, an N,N-dialkylsulfamoyl group, an N-arylsulfamoyl group, an N,N-diarylsulfamoylgroup, anN-alkyl-N-aryl-sulfamoyl group, an N-acylsulfamoyl group and a Conjugate base group thereof, an N-alkylsulfonylsulfamoyl group ($—SO_2NHSO_2$(alkyl)) and a conjugate base group thereof, an N-arylsulfonylsulfamoyl group ($—SO_2NHSO_2$(aryl)) and a conjugate base group thereof, an N-alkylsulfonylcarbamoyl group ($—CONHSO_2$(alkyl)) and a conjugate base group thereof, an N-arylsulfonylcarbamoyl group ($—CONHSO_2$(aryl)) and a conjugate base group thereof, an alkoxysilyl group (—Si(Oalkyl)$_3$), an aryloxysilyl group (—Si)Oaryl)$_3$), a hydroxysilyl group ($—Si(OH)_3$) and a conjugate base group thereof, a phosphono group ($—PO_3H_2$) and a conjugate base group thereof, a dialkylphosphono group ($—PO_3$(alkyl)$_2$), a diarylphosphono group ($—PO_3$(aryl)$_2$), an alkylarylphosphono group ($—PO_3$(alkyl) (aryl)), a monoalkylphosphono group ($—PO_3H$(alkyl)) and a conjugate base group thereof, a monoarylphosphono group ($—PO_3H$(aryl)) and a conjugate base group thereof, a phosphonooxy group ($—OPO_3H_2$) and a conjugate base group thereof, a dialkylphosphonooxy group ($—OPO_3$(alkyl)$_2$), a diarylphosphonooxy group ($—OPO_3$(aryl)$_2$), an alkylarylphosphonooxy group ($—OPO_3$(alkyl) (aryl)), a monoalkylphosphonooxy group ($—OPO_3H$(alkyl)) and a conjugate base group thereof, a monoarylphosphonooxy group ($—OPO_3H$(aryl)) and a conjugate base group thereof, a cyano group, a nitro group, a dialkylboryl group (—B(alkyl)$_2$), a diarylboryl group (—B(aryl)$_2$), an alkylarylboryl group (—B(alkyl) (aryl)), a dihydroxyboryl group ($—B(OH)_2$) and a conjugate base group thereof, an alkylhydroxyboryl group (—B(alkyl) (OH)) and a conjugate base group thereof, an arylhydroxyboryl group (—B(aryl)(OH)) and a conjugate base group thereof, an aryl group, an alkenyl group, and an alkynyl group.

When the photosensitive composition of the invention is applied to a lithographic printing plate precursor, although it depends upon the design of the photosensitive layer, substituents having a hydrogen atom capable of forming a hydrogen bond and, in particular, substituents having an acidity having an acid dissociation constant (pKa) smaller than that of a carboxylic acid are liable to lower press life, therefore these substituents are not preferred. On the other hand, hydrophobic substituents, e.g., a halogen atom, a hydrocarbon group (e.g., an alkyl group, an aryl group, an alkenyl group, an alkynyl group), an alkoxyl group, and an aryloxy group have a tendency to improve press life, thus they are preferably used. In particular, in the case where the cyclic structure is 6-membered or lower monocyclic aliphatic hydrocarbon, e.g., cyclopentane and cyclohexane, it is preferred to have the hydrophobic substituent. The substituent, if possible, may be bonded to each other, or to the hydrocarbon group on which they are substituted, to form a ring, and the substituents may further be substituted.

In the case where A in formula (i) represents $NR^3$—, $R^3$ represents a hydrogen atom or a monovalent hydrocarbon group having from 1 to 10 carbon atoms. As the monovalent hydrocarbon group having from 1 to 10 carbon atoms represented by $R^3$, an alkyl group, an aryl group, an alkenyl group and an alkynyl group are exemplified.

As specific examples of the alkyl groups, straight chain, branched or cyclic alkyl groups having from 1 to 10 carbon atoms are exemplified, e.g., a methyl group, an ethyl group, a propyl group, a butyl group, a pentyl group, a hexyl group, a heptyl group, anoctyl group, anonyl group, adecyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group and a 2-norbornyl group are exemplified.

As specific examples of the aryl groups, aryl groups having from 1 to 10 carbon atoms, e.g., a phenyl group, a naphthyl group and an indenyl group, and hetero aryl groups having one hetero atom selected from the group consisting of a nitrogen atom, an oxygen atom and a sulfur atom and having from 1 to 10 carbon atoms, e.g., a furyl group, a thienyl group, a pyrrolyl group, a pyridyl group and a quinolyl group are exemplified. As specific examples of the alkenyl groups, straight chain, branched or cyclic alkenyl groups having from 1 to 10 carbon atoms, e.g., a vinyl group, a 1-propenyl group, a 1-butenyl group, a 1-methyl-1-propenyl group, a 1-cyclo-pentenyl group and a 1-cyclohexenyl group are exemplified.

As specific examples of the alkynyl groups, alkynyl groups having from 1 to 10 carbon atoms, e.g., an ethynyl group, a 1-propynyl group, a 1-butynyl group and a 1-octynyl group are exemplified. The substituents that $R^3$ may have are same as those exemplified as the substituent for $R^2$, provided that the carbon atom number of $R^3$ is from 1 to 10 including the carbon atom number of the substituent.

A in formula (i) preferably represents an oxygen atom or —NH— for the easiness of synthesis.

n In formula (i) represents an integer of from 1 to 5, preferably 1 in the point of press life.

Preferred specific examples of the repeating units represented by formula (i) are shown below, but the present invention is not limited to these compounds.

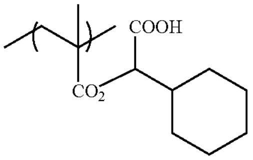

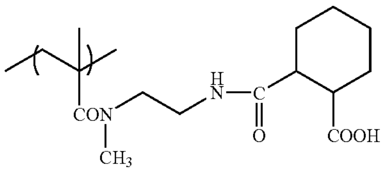

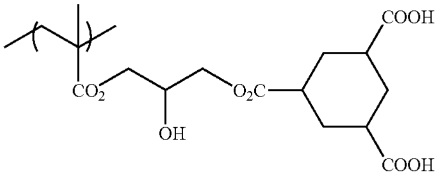

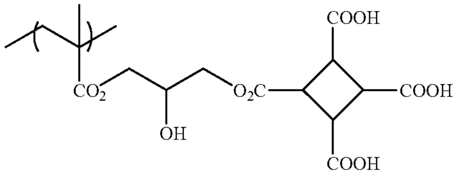

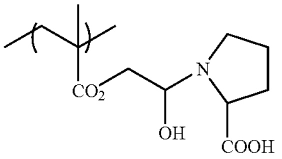

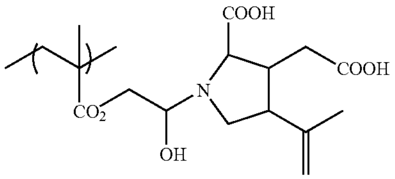

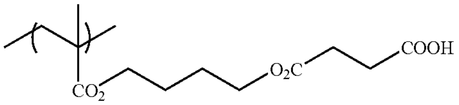

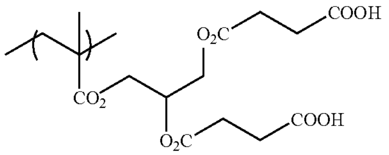

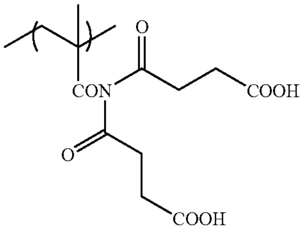

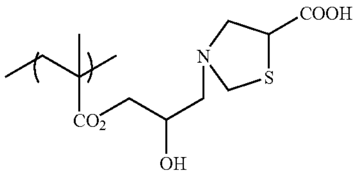

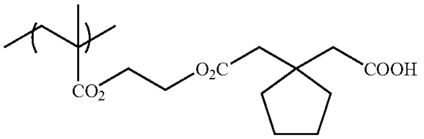

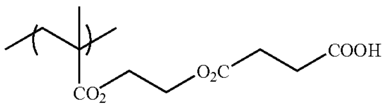

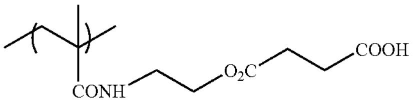

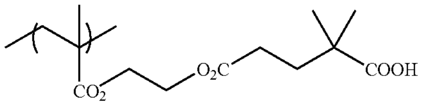

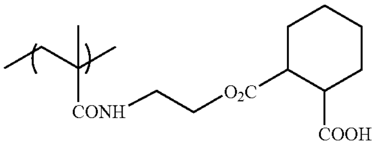

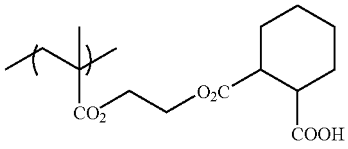

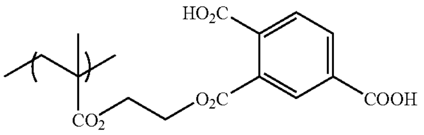

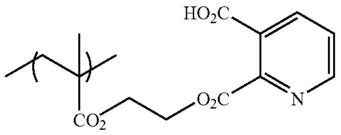

-continued
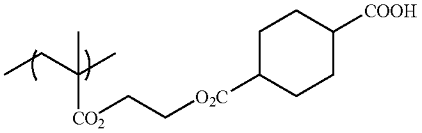
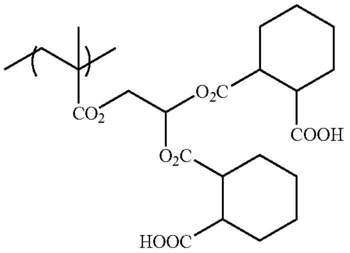
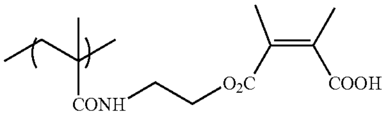
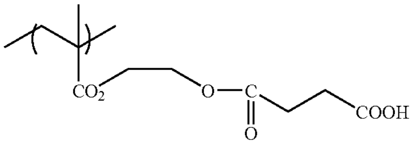
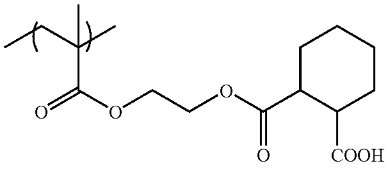
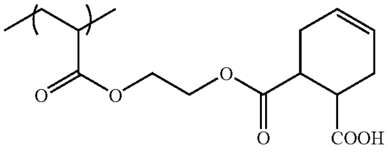
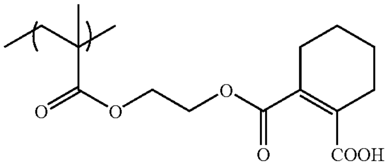
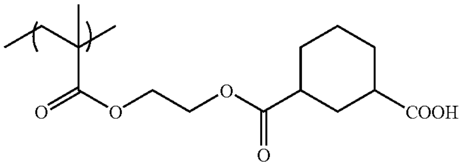
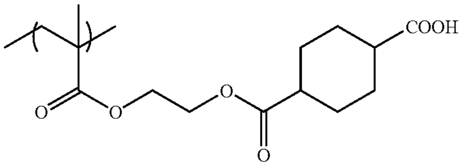
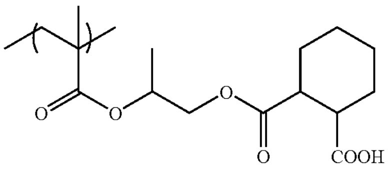
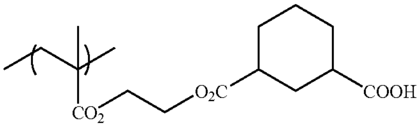
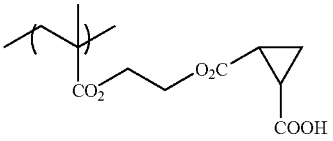
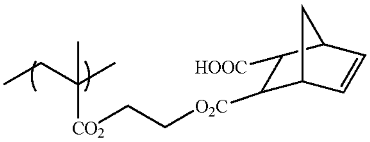
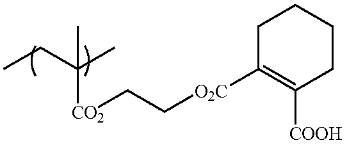
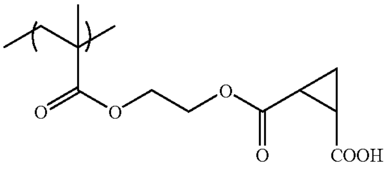
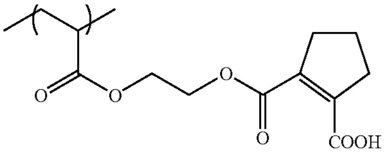
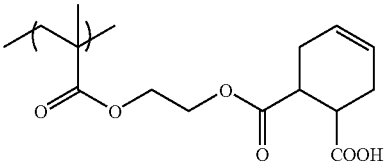
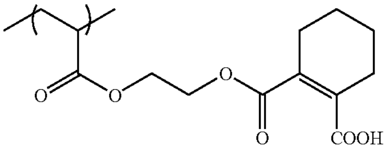
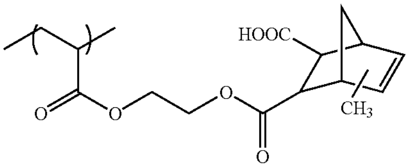
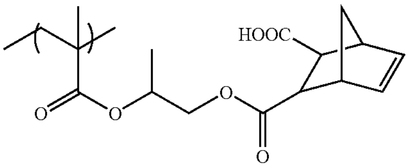

-continued
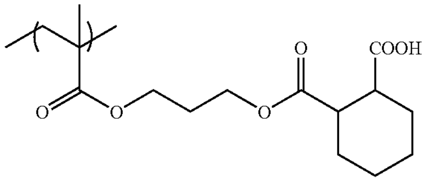
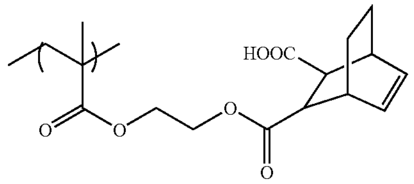
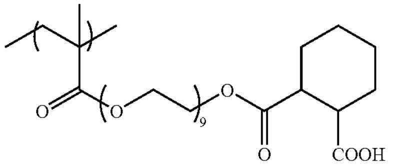
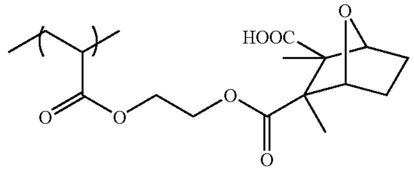
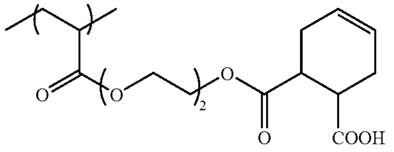
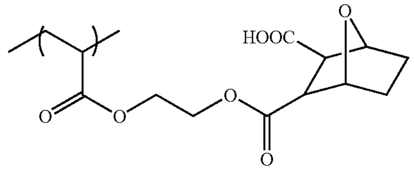
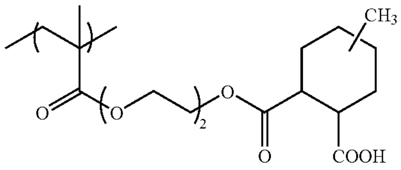
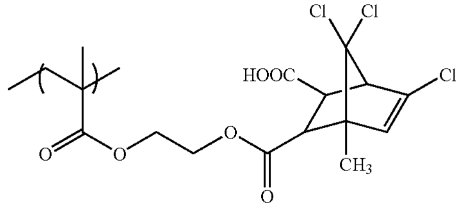
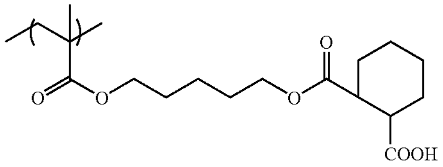
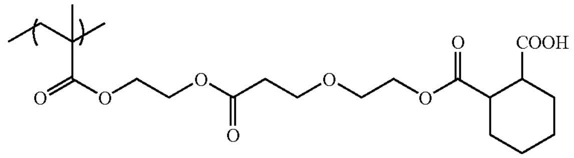
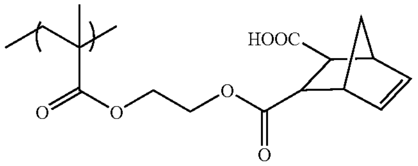
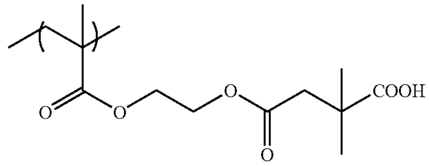
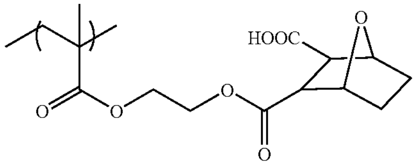
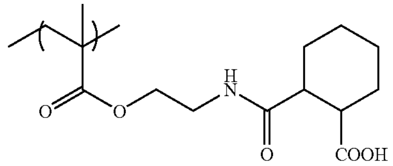
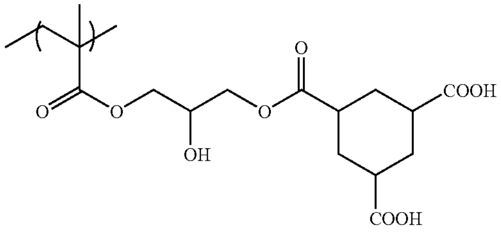
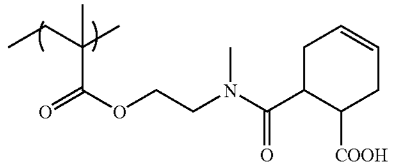
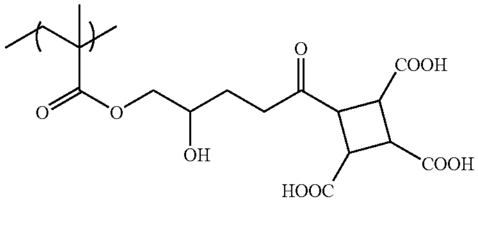
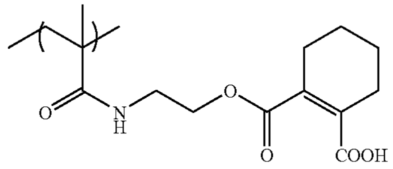

-continued
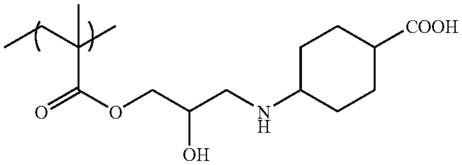
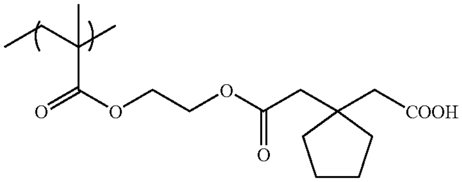
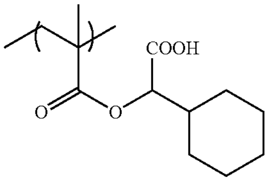
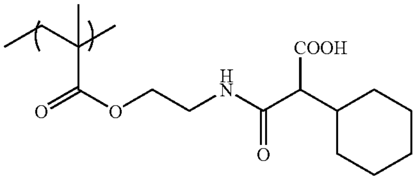
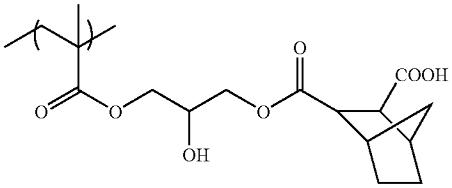
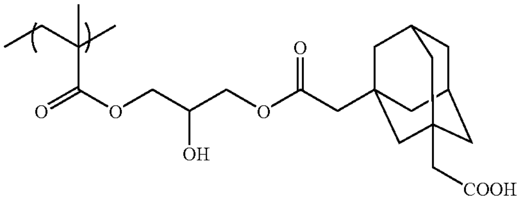
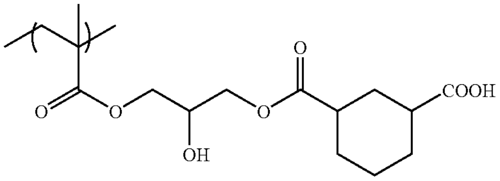
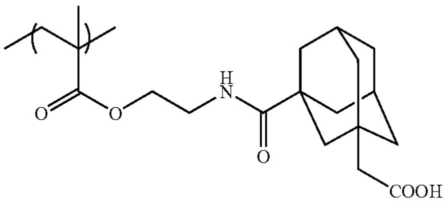
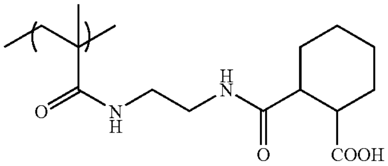
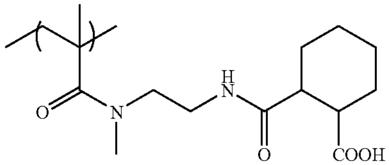
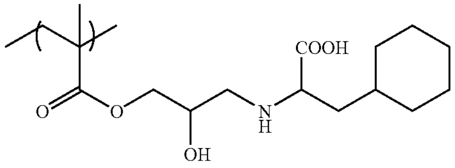
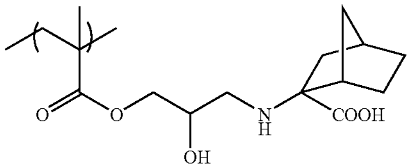
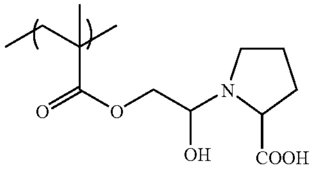
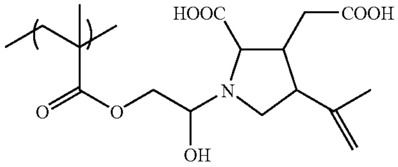
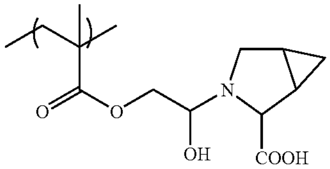
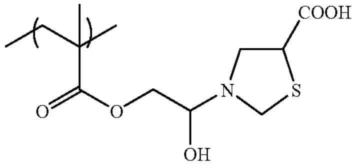
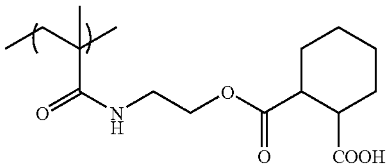
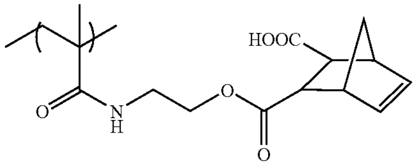

-continued
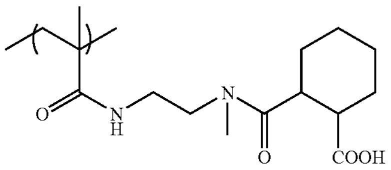
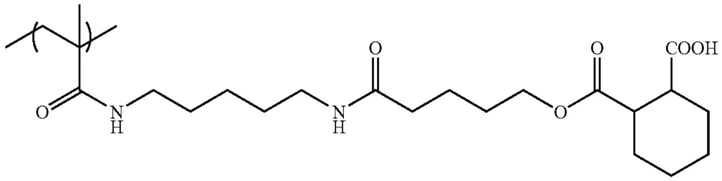
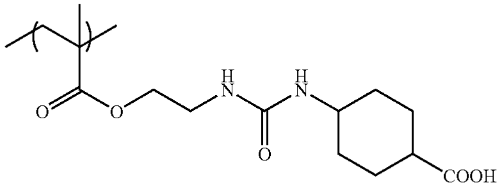
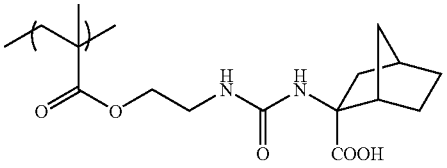
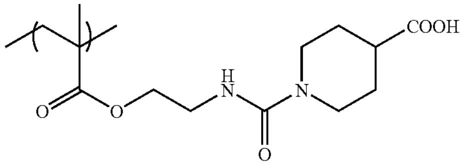
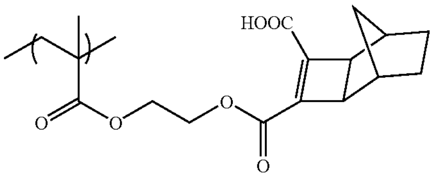
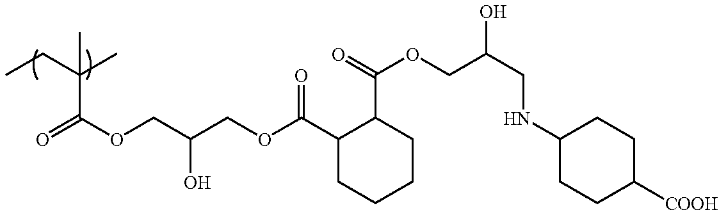
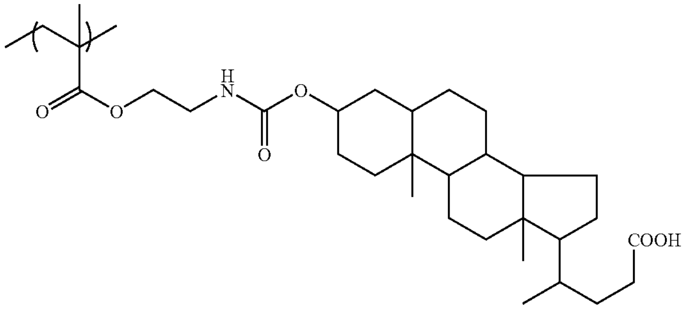
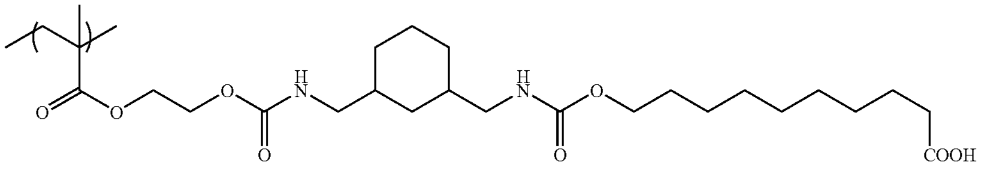
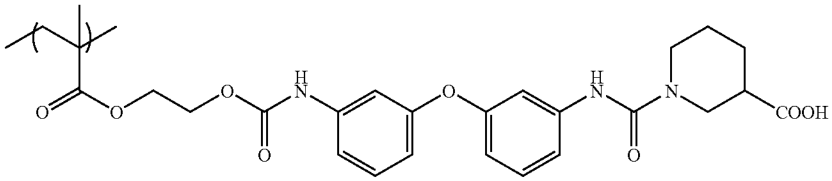

-continued

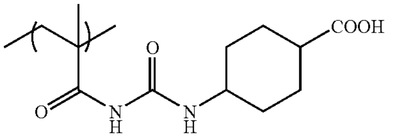

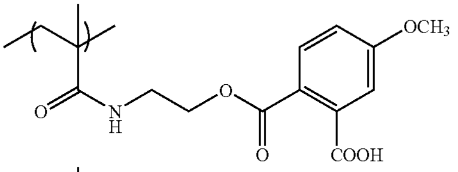

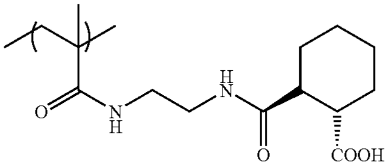

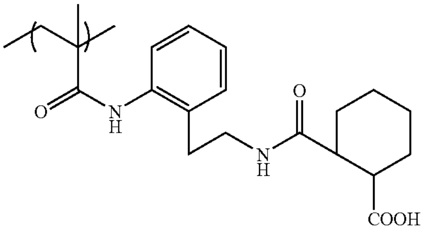

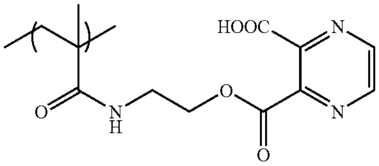

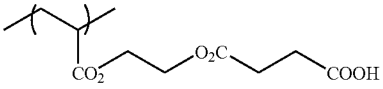

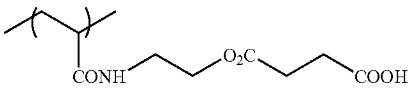

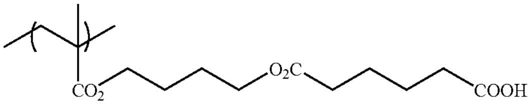

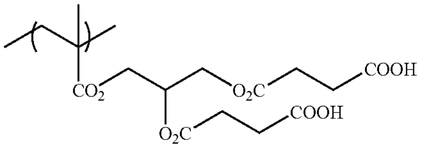

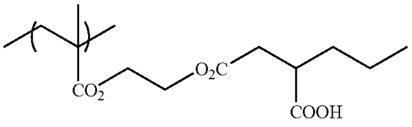

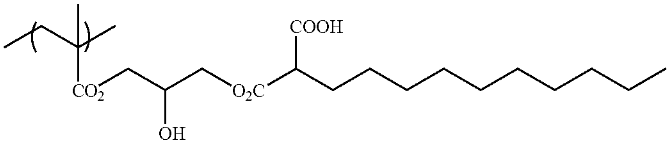

The repeating units represented by formula (i) may be contained alone or in combination of two or more thereof in the specific binder polymer. The total amount of the repeating unit represented by formula (i) in the specific binder polymer is preferably from 1 to 99 mol %, more preferably from 5 to 40 mol %, and still more preferably from 5 to 20 mol %, based on the total molar amount of the polymer components, although the amount can be appropriately determined according to the structure of the polymer and the design of the composition.

Besides the above components, the specific binder polymer may contain other polymerizable components. As other polymerizable components, conventionally well-known polymerizable components can be used without limitation so long as they are radical polymerizable monomers. Specifically, monomers described in *Kobunshi Handbook—Kiso-Hen* (*Polymer Handbook—Elementary Course*), compiled by Kobunshi Gakkai and published by Baifukan (1986) are exemplified. Such other polymerizable components may be used alone or in combination of two or more thereof.

The molecular weight of the specific binder polymer is appropriately determined from the viewpoints of, e.g., image forming property and press life of a lithographic printing plate precursor. The molecular weight is preferably from 2,000 to 1,000,000, more preferably from 5,000 to 500,000, and still more preferably from 10,000 to 200,000.

The glass transition point (Tg) of the specific binder polymer is preferably from 70 to 300° C., more preferably from 80 to 250° C., and most preferably from 90 to 200° C. When the glass transition point is lower than 70° C., the storage stability lowers, and sometimes press life decreases when the photosensitive composition is used in a lithographic printing plate precursor. When it is higher than 300° C., the degree of radical transfer in the composition lowers and sometimes the sensitivity may decrease.

For heightening the glass transition point of the specific binder polymer, it is preferred to incorporate an amido group or an imido group, particularly preferably methacrylamido or a methacrylamido derivative into the specific binder polymer.

The specific binder polymer may be used alone or in combination with one or more other binder polymers. Other binder polymer is used in an amount of from 1 to 60 wt %, preferably. from 1 to 40 wt %, and more preferably from 1 to 20 wt %, based on the total weight of the binder polymer component. As other binder polymer, conventionally well-known binder polymers can be used without limitation, and specifically a binder having acrylic main chain and a urethane binder widely used in the field of art are preferably used.

The total amount of the specific binder polymer and other binder polymer usable in combination in the photosensitive composition of the invention can be appropriately determined, and the amount is ordinarily from 10 to 9 wt %, preferably from 20 to 80 wt %, and more preferably from 30 to 70 wt %, based on the total weight of the non-volatile component in the composition.

In addition to the above fundamental components, the photosensitive composition of the invention can further optionally contain other components suitable for the use and the production process thereof. Preferred additives are described below.

Polymerization Inhibitor:

It is preferred for the photosensitive composition according to the invention to contain a small amount of thermal polymerization inhibitor for the purpose of inhibiting undesirable thermal polymerization of a compound having a polymerizable ethylenic unsaturated double bond, i.e., a polymerizable compound. As the appropriate thermal polymerization inhibitor, hydroquinone, p-methoxyphenol, di-tert-butyl-p-cresol, pyrogallol, tert-butylcatechol, benzoquinone, 4,4'-thiobis (3-methyl-6-tert-butylphenol), 2,2'-methylenebis(4-methyl-6-tert-butylphenol) and N-nitrosophenylhydroxyamine primary cerium salt can be exemplified. The amount of the thermal polymerization inhibitor is preferably from about 0.01 to about 5 wt % based on the weight of the non-volatile component in the entire composition. Further, if desired, a higher fatty acid derivative, such as behenic acid and behenic acid ainide, may be added and localize on the surface of the photosensitive layer during the drying process after coating to inhibit polymerization hindrance due to oxygen. The amount of the higher fatty acid derivative is preferably from about 0.5 wt % to about 10 wt % based on the non-volatile component in the entire composition.

Colorant:

Further, a dye or a pigment may be added to the photosensitive composition of the invention for the purpose of coloration. A so-called plate-inspection property, e.g., visibility after plate-making and aptitude to an image densitometer as a printing plate can be improved due to the addition of colorant. Since many of dyes are liable to reduce the sensitivity of a photopolymerizable photosensitive layer, the use of pigment is particularly preferred as the colorant. Specific examples of the colorant include, e.g., pigments such as phthalocyanine pigments, azo pigments, carbon black and titanium oxide, and dyes such as Ethyl violet, Crystal Violet, azo dyes, anthraquinone dyes and cyanine dyes. The amount of dye and pigment is preferably from about 0.5 to about 5 wt % based on the non-volatile component in the entire composition.

Other Additives:

Well-known additives such as inorganic fillers for improving the physical properties of a cured film, plasticizers, and oil-sensitizing agents capable of improving the ink receptive property of a photosensitive layer surface may further be added to the photosensitive composition. As the plasticizer, e.g., dioctyl phthalate, didodecyl phthalate, triethylene glycol dicaprylate, dimethyl glycol phthalate, tricresyl phosphate, dioctyl adipate, dibutyl sebacate, triacetyl glycerin are exemplified, and it can be ordinarily used in the range of 10 wt % or less based on the total weight of the binder polymer and the addition polymerizable compound. In addition, a UV initiator and a thermal crosslinking agent can also be added to the photosensitive composition of the invention for reinforcing the effect of heating or exposure after development for the purpose of improving the film strength (elongation of press life) in the lithographic printing plate precursor described below.

The photosensitive composition according to the invention can be preferably used as a photosensitive layer in a lithographic printing plate precursor described below.

Lithographic Printing Plate Precursor:

The lithographic printing plate precursor of the present invention is a lithographic printing plate precursor comprising a support having thereon a photosensitive layer and a protective layer in order, and the photosensitive layer contains the photosensitive composition of the invention. The lithographic printing plate precursor can be produced by coating a coating solution for photosensitive layer containing the photosensitive composition of the invention or a solution prepared by dissolving components of a desired layer, e.g., a protective layer and the like, in a solvent on an appropriate support or an intermediate layer.

Photosensitive Layer:

The photosensitive layer in the present invention is preferably a thermal polymerization negative photosensitive layer containing the infrared absorber, the onium salt (polymerization initiator), the polymerizable compound (also referred to as an addition polymerizable compound) represented by formula (I), and a binder polymer. Such a thermal polymerization negative photosensitive layer has a mechanism that the infrared absorber absorbs infrared laser beams and converts the absorbed infrared laser beams to heat, the polymerization initiator is decomposed by the heat to generate a radical, and the polymerizable compound causes a polymerization reaction by the generated radical. Further, the lithographic printing plate precursor of the invention is particularly suitable for plate-making by direct drawing with infrared laser beams having a wavelength of from 760 to 1,200 nm, and exhibits high press life and an image-forming property as compared with conventional lithographic printing plate precursors.

The photosensitive composition of the invention is dissolved in various organic solvents and the photosensitive layer is coated on a support or an intermediate layer. Examples of the solvent used include acetone, methyl ethyl ketone, cyclohexane, ethyl acetate, ethylene dichloride, tetrahydrofuran, toluene, ethylene glycol monomethyl ether, ethylene glycolmonoethyl ether, ethylene glycol dimethyl ether, propylene glycol monomethyl ether, propylene glycol monoethyl ether, acetylacetone, cyclohexanone, diacetone alcohol, ethylene glycolmonomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used alone or as a mixture of two or more thereof. The concentration of the solid content in the coating solution is ordinarily from 2 to 50 wt %.

The coating amount of the photosensitive layer primarily influences sensitivity of the photosensitive layer, a developing property, the strength of the exposed film and press life, therefore, it is preferred to appropriately select the coating amount according to the purpose. Too small the coating amount results in insufficient press life. When the amount is too large, sensitivity decreases, exposure takes long time, and long time is required for development processing, which is not advantageous. As a lithographic printing plate precursor for scanning exposure, which is a primary object of the present invention, the coating amount of the photosensitive layer is preferably from about 0.1 to about 10 $g/m^2$, more preferably from 0.5 to 5 $g/m^2$ in terms of after drying.

Support:

As the support of the lithographic printing plate precursor of the invention, conventionally well-known hydrophilic supports widely used in lithographic printing plate precursors can be used without any limitation.

The support for use in the present invention is preferably a plate-like support having dimensional stability. For example, paper, paper laminated with plastics (e.g., polyethylene, polypropylene, polystyrene, etc.), a metal plate (e.g., aluminum, zinc, copper, etc.), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or a plastic film laminated or deposited with the above metal can be exemplified. The surface of the support may be chemically or physically treated by well-known methods for the purpose of providing hydrophilicity or improvement of strength, if desired.

As particularly preferred support, paper, a polyester film and an aluminum sheet are exemplified, and an aluminum sheet, which is dimensionally stable, comparatively inexpensive, and capable of providing a highly hydrophilic and strong surface by surface treatment according to necessity, is more preferably used. A composite sheet comprising a polyethylene terephthalate film having bonded thereon an aluminum sheet as disclosed in JP-B-48-18327 is also preferred.

An aluminum sheet is a metal sheet comprising dimensionally stable aluminum as a main component, and the aluminum sheet is selected from, besides a pure aluminum sheet, an alloy sheet containing aluminum as a main component and a trace amount of different elements, and a plastic film or paper laminated or deposited with aluminum (alloy). In the following explanation, substrates comprising aluminum or aluminum alloy are collectively called aluminum substrates. Examples of the different element contained in the aluminum alloy include silicon, iron, manganese, copper, magnesium, chromium, zinc, bismuth, nickel and titanium. The different element content in aluminum alloy is 10 wt % or less. In the present invention, a pure aluminum sheet is preferred but 100% pure aluminum is difficult to produce in view of the refining technique, accordingly, a slight amount of different elements may be contained. Thus, the composition of aluminum sheet used in the invention is not particularly restricted, and aluminum sheets of conventionally well-known and commonly used, e.g., JIS A 1050, JIS A 1100, JIS A 3103 and JIS A 3005, can be appropriately used.

The aluminum substrate for use in the present invention has a thickness of from about 0.1 to about 0.6 mm. The thickness can be appropriately changed according to the size of a printing press, the size of a printing plate and the desire of user. The aluminum substrate may be subjected to surface treatment as described below, if desired, or of course may not be subjected.

Surface Roughening Treatment:

As surface roughening treatment methods, there are mechanical surface roughening, chemical etching, and electrolytic graining as disclosed in JP-A-56-28893. Further, an electrochemical surface roughening method of performing surface roughening electrochemically in a hydrochloric acid or nitric acid electrolyte, and mechanical surface roughening methods, e.g., a wire brush graining method of scratching an aluminum surface with metal wire, a ball graining method of graining an aluminum surface with abrading balls and an abrasive, and a brush graining method of graining an aluminum surface with a nylon brush and an abrasive can be used. The surface roughening methods can be used alone or in combination.

Of these methods, a useful surface roughening method is the electrochemical surface roughening method of performing surface roughening electrochemically in a hydrochloric acid or nitric acid electrolyte. A preferred quantity of anode electricity is from 50 to 400 $C/dm^2$. Further specifically, it is preferred to perform electrolysis in an electrolyte containing from 0.1 to 50% of a hydrochloric acid or a nitric acid by direct current and/or alternating current on condition of from 20 to 80° C. for 1 second to 30 minutes and electric current density of from 100 to 400 $C/dm^2$.

The aluminum substrate subjected to the surface roughening treatment in such manner may be then subjected to chemical etching with an acid or an alkali. An etchant preferably used in the invention includes sodium hydroxide, sodium carbonate, sodium aluminate, sodium metasilicate, sodium phosphate, potassium hydroxide and lithium hydroxide, and preferred ranges of concentration and temperature are from 1 to 50% and from 20 to 100° C., respectively. To remove smut remaining on the surface of the aluminum substrate after the etching treatment, the aluminum sheet is washed with an acid. As the acid used for washing, e.g., a nitric acid, a sulfuric acid, a phosphoric acid, a chromic acid, a fluoric acid and a borofluoric acid can be exemplified. In particular, as preferred smut-removing method after electrochemical surface roughening treatment, a method of bringing the aluminum substrate into contact with a 15 to 65 wt % sulfuric acid at 50 to 90° C. as disclosed in JP-A-53-12739, and an alkali etching method as disclosed in JP-B-48-28123 are exemplified. Surface roughening methods and conditions are not particularly restricted so long as the center line average surface roughness (Ra) of the treated surface after treatment is from 0.2 to 0.5 μm.

Anodizing Treatment:

The thus-treated aluminum substrate on which an oxide is formed is further subjected to anodizing treatment.

In the anodizing treatment, an aqueous solution of a sulfuric acid, a phosphoric acid, an oxalic acid, or a boric acid/sodium borate is used alone or in combination of two or more thereof as a main component of an electrolytic bath. At this time, the components ordinarily contained in Al alloy sheet, electrode, city water and ground water may be at least contained in the electrolyte. Further, the second and third components may be contained. The second and third components includes a cation, for example, a metal ion of, e.g., Na, K, Mg, Li, Ca, Ti, Al, V, Cr, Mn, Fe, Co, Ni, Cu or Zn or an ammonium ion; and an anion, e.g., a nitrate ion, a carbonate ion, a chlorine ion, a phosphate ion, a fluorine ion, a sulfite ion, a titanate ion, a silicate ion or a borate ion. The ion can be contained in concentration of 0 to 10,000 ppm or so. The conditions of anodizing treatment are not particularly restricted, but preferably the concentration of an acid as the main component of the electrolytic bath is from 30 to 500 g/liter, the temperature of the solution is from 10 to 70° C., the electric current density is from 0.1 to 40 $A/dm^2$, and the treatment is performed by direct current or alternating current electrolysis. The thickness of the anodic oxide film formed is from 0.5 to 1.5 μm, preferably from 0.5 to 1.0 μm. The treatment conditions should be selected so that the pore diameter of the micro pores on the anodic oxide film of the support formed by the treatment is from 5 to 10 nm, and the pore density reaches the range of from $8\times10^{15}$ to $2\times10^{16}/m^2$.

As the hydrophilization treatment of a support surface, well-known methods can be used. As particularly preferred treatment, hydrophilization treatment with silicate or polyvinylphosphonic acid is carried out. The amount of film formed is preferably from 2 to 40 $mg/m^2$, more preferably from 4 to 30 $mg/m^2$, as Si or P element. The coating amount can be measured according to a fluorescent X-ray analyzing method.

The hydrophilization treatment is carried out by immersing the aluminum substrate having formed thereon an anodic oxide film in an aqueous solution of alkali metal silicate or polyvinylphosphonic acid in concentration of from 1 to 30 wt %, preferably from 2 to 15 wt % having pH of from 10 to 13 at 25° C., at 15 to 80° C. for from 0.5 to 120 seconds.

As the alkali metal silicate used in hydrophilization treatment, sodium silicate, potassium silicate and lithium silicate are used. In the hydrophilization treatment, a hydroxide, e.g., a sodium hydroxide, a potassium hydroxide or a lithiumhydroxide is added to the alkali metal silicate aqueous solution to increase the pH of the solution. Further, an alkaline earth metal salt or metal salt belonging to IVb group may be added to the alkali metal silicate aqueous solution. As the alkaline earth metal salt, nitrate of alkaline earth metal salt, e.g., calcium nitrate, strontium nitrate, magnesium nitrate, and barium nitrate, and water-soluble salt of alkaline earth metal salt, e.g., sulfate, hydrochloride, phosphate, acetate, oxalate and borate are exemplified. As the metal salt belonging to Ivb group, titanium tetrachloride, titanium trichloride, potassium titanium fluoride, potassium titanium oxalate, titanium sulfate, titanium tetraiodide, zirconium chloride oxide, zirconium dioxide, zirconium oxychloride, and zirconium tetrachloride are exemplified.

The alkaline earth metal salts and metal salts belonging to IVb group can be used alone or in combination of two or more thereof. The metal salt is preferably used in an amount of from 0.01 to 10 wt %, more preferably from 0.05 to 5.0 wt %. Silicate electrodeposition as disclosed in U.S. Pat. No. 3,658,662 is also effective. Supports subjected to the electrolytic graining, anodizing treatment and hydrophilization treatment as disclosed in JP-B-46-27481, JP-A-52-58602 and JP-A-52-30503 are also useful.

Intermediate Layer (Undercoat Layer).

In the lithographic printing plate precursor, an intermediate layer may be provided for the purpose of improving adhesion between the photosensitive layer and the support, and stain resistance. As specific examples of the intermediate layer, those disclosed in the following patents can be preferably used.

JP-B-50-7481, JP-A-54-72104, JP-A-59-101651, JP-A-60-149491, JP-A-60-232998, JP-A-3-56177, JP-A-4-282637, JP-A-5-16558, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, JP-A-11-38635, JP-A-11-38629, JP-A-10-282645, JP-A-10-301262, JP-A-11-24277, JP-A-11-109641, JP-A-10-319600, JP-A-11-327152, JP-A-2000-10192, JP-A-2000-235254, JP-A-2000-352824, 2001-175001 and JP-A-2001-209170.

Protective Layer (Overcoat Layer):

Since the photosensitive layer of the lithographic printing plate precursor of the invention is a thermal polymerization negative photosensitive layer, exposure is performed in the air, accordingly it is preferred to provide a protective layer (also referred to as an overcoat layer) on the photosensitive layer. The protective layer is provided fundamentally to protect the photosensitive layer but has a role of an oxygen-shielding layer when the photosensitive layer has a radical polymerizable image-forming mechanism as in the present invention, and functions as an ablation-preventing layer when exposure is performed with high illuminance infrared laser beams.

Besides the above, as the characteristics required of the protective layer, it is preferred that the protective layer do not substantially hinder the transmission of light for exposure, be excellent in adhesion with the photosensitive layer, and can be easily removed during the development process after exposure. Contrivances on the protective layer have so far been made and disclosed in detail in U.S. Pat. No. 3,458,311 and JP-A-55-49729.

As the materials of the protective layer, water-soluble polymer compounds relatively excellent in crystallizability are preferably used, specifically water-soluble polymers, e.g., polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid and polyacrylamide are known, and they can be used alone or as a mixture. Of these compounds, when polyvinyl alcohol is used as a main component, the best results can be obtained in fundamental characteristics such as shielding of oxygen and removal of the protective layer by development.

A mixture of poly vinyl alcohol from 15 to 50 wt %, preferably from 10 to 25 wt %, of which is substituted with polyvinyl pyrrolidone is preferred from the viewpoint of storage stability.

Polyvinyl alcohol for use in the protective layer may be partially substituted with ester, ether and acetal so long as they contain unsubstituted vinyl alcohol units for obtaining a necessary oxygen-shielding property and water solubility. Also, a part of polyvinyl alcohol may have other copolymer component.

A specific examples of polyvinyl alcohol, those having hydrolyzing rate of 71 to 100% and polymerization repeating unit of from 300 to 2,400 can be exemplified.

Specifically, examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-45, 0PVA-420, PVA-613, and L-8 (manufactured by Kuraray Co., Ltd.).

The components of the protective layer (the selection of PVA and the use of additives) and the coating amount are selected taking into consideration fogging characteristic, adhesion and scratch resistance besides the oxygen-shielding property and the removability by development. In general, the higher the hydrolyzing rate of the PVA used (the higher the unsubstituted vinyl alcohol unit content in the oxygen-shielding layer) and the larger the layer thickness, the higher is the oxygen-shielding property, thus advantageous in the point of sensitivity. Too high the oxygen-shielding property, however, results in the generation of undesirable polymerization reaction during the manufacture and storage before exposure, or the occurrence of undesirable fog and thickening of image lines at image exposure.

Accordingly, oxygen permeability (A) at 25° C. under 1 atom is preferably, $0.2 \leqq A \leqq 20$ ($ml/m^2\cdot day$).

The molecular weight of the (co) polymer such as polyvinyl alcohol (PVA) is ordinarily from 2,000 to 10,000,000, and preferably from 20,000 to 3,000,000.

As other components of the protective layer, glycerol or dipropylene glycol corresponding to several wt % can be added to the (co)polymers to provide flexibility. Further, anionic surfactants, e.g., sodium alkylsulfate and sodium alkylsulfonate; amphoteric surfactants, e.g., alkylamino-carboxylate and alkylaminodicarboxylate; and nonionic surfactants, e.g., polyoxyethylene alkyl phenyl ether, can be added to the (co)polymers each in an amount of several wt %.

The layer thickness of the protective layer is preferably from 0.5 to 5 μm, and is particularly preferably from 0.5 to 2.5 μm.

The adhesion of the protective layer to the photosensitive layer and scratch resistance are also extremely important in treating a printing plate. Specifically, when a hydrophilic layer comprising water-soluble polymer is laminated on a lipophilic photosensitive layer, layer peeling due to insufficient adhesion is liable to occur, and the peeled part causes such a defect as film hardening failure due to polymerization hindrance by oxygen. Various proposals have been made for improving the adhesion of the photosensitive layer and the protective layer. For example, it is disclosed in U.S. patent application Nos. 292,501 and 44,563 that a sufficient adhesion property can be obtained by mixing from 20 to 60 wt % of an acryl-based emulsion or a water-insoluble vinyl pyrrolidone/vinyl acetate copolymer with a hydrophilic polymer mainly comprising polyvinyl alcohol and laminating the resulting product on the photosensitive layer. Any of these well-known techniques can be applied to the protective layer of the present invention. Coating methods of the protective layer are disclosed in detail, e.g., in U.S. Pat. No. 3,458,311 and JP-B-55-49729.

For manufacturing a lithographic printing plate from the lithographic printing plate precursor of the invention, at least processes of exposure and development are performed.

As the light source for the exposure of the lithographic printing plate precursor of the invention, an infrared laser is preferably used, and exposure with an ultraviolet lamp and thermal recording with a thermal head is also possible.

Above all, image exposure with a solid state laser and a semiconductor laser radiating infrared rays of the wavelength of from 750 to 1,400 nm is particularly preferably applied to the present invention. The output of lasers is preferably 100 mW or higher, and it is preferred to use a multi-beam laser device for shortening the exposure time. The exposure time per a pixel is preferably not longer than 20 μsec. The quantity of energy radiated to the lithographic printing plate precursor is preferably from 10 to 300 mJ/cm$^2$. When the exposure energy is too low, hardening of the photosensitive layer does not proceed sufficiently on the other hand, when the energy is too high, the photosensitive layer is susceptible to ablation by the laser and the image is sometimes damaged.

In the exposure in the invention, the beams of lights from the light source can be overlapped. The overlapping means that the sub-scanning pitch width is smaller than the beam diameter. When the beam diameter is expressed by the half value width (FWHM) of the beam strength, the overlapping can be expressed quantitatively by FWHM/sub-scanning pitch width (overlap index). The overlap index is preferably 0.1 or more in the invention.

The scanning method of the light source of exposure apparatus for use in the invention is not especially limited, e.g., a cylinder outside surface scanning method, a cylinder inside surface scanning method, and a plane surface scanning method can be used. A channel of the light source may be a single channel or multi-channel, but the multi-channel is preferably used in the case of the cylinder outside surface scanning method.

In the present invention, a development process may be carried out immediately after the exposure, or a heating process may be performed between the exposure and development process. The heating process is preferably performed at 60 to 150° C. for 5 seconds to 5 minutes.

The heating process can be appropriately selected from various well-known methods. Specifically, a method of heating the lithographic printing plate precursor while being in contact with a panel heater or a ceramic heater, and a method of heating the lithographic printing plate precursor with a lamp or a hot air by non-contact system are exemplified. By performing the heating process, the reduction of the quantity of laser energy necessary for image recording can be achieved.

In the present invention, the protective layer may be removed by pre-washing before the development process. For example, city water is used in pre-washing.

The lithographic printing plate precursor in the invention is development processed after the exposure or after undergoing the heating process and pre-washing process. The developing solution for use in the development process is preferably an aqueous alkali solution having pH of 14 or lower, and more preferably an aqueous alkali solution having pH of from 8 to 12 and containing an anionic surfactant. As examples of the alkali agent, inorganic alkali agents, e.g., sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithiumhydroxide are exemplified. In addition, organic alkali agents, e.g., monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanol-amine, monoisopropanolamine, diisopropanolamine, ethylene-imine, ethylenediamine and pyridine are also used. The alkali agents are used alone or in combination of two or more thereof.

Further, in the development processing of the lithographic printing plate precursor of the invention, from 1 to 20 wt %, more preferably from 3 to 10 wt %, of an anionic surfactant is used. Too small the amount of anionic surfactant results in the lowering of a developing property, while too large the amount is accompanied with disadvantages, e.g., the deterioration of the strength such as abrasion resistance of the image. Examples of the anionic surfactant include sodium lauryl alcohol sulfate, ammonium lauryl alcohol sulfate, sodium octyl alcohol sulfate, alkylaryl sulfonates, e.g., sodium isopropylnaphthalene sulfonate, sodium isobutylnaphthalene sulfonate, sodium polyoxyethylene glycol mononaphthyl ether sulfate, sodium dodecylbenzene sulfonate, and sodium metanitrobenzene sulfonate, higher alcohol sulfates having from 8 to 22 carbon atoms, e.g., secondary sodium alkylsulfate, aliphatic alcohol phosphates, e.g., sodium cetyl alcohol phosphate, sulfonates of alkyl amide, e.g., $C_{17}H_{33}CON(CH_3)CH_2CH_2SO_3Na$, and sulfonates of dibasic aliphatic ester, e.g., sodium dioctyl sulfosuccinate and sodium dihexyl sulfosuccinate.

Further, if desired, an organic solvent mixable with water, e.g., benzyl alcohol, may be added to the developing solution. As the organic solvent, that having the solubility in water of 10 wt % or lower, preferably 5 wt % or lower, is preferably used. For example, 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol are exemplified. The amount of organic solvent is preferably from 1 to 5 wt % based on the total amount of the developing solution in use. Since the amount of organic solvent is closely related with the amount of anionic surfactant, it is preferred to increase the amount of anionic surfactant as the amount of organic solvent is increased. The reason for this is that when the amount of organic solvent is increased while the amount of anionic surfactant is small, the organic solvent is not dissolved, accordingly a good developing property cannot be ensured.

Further, if desired, additives, e.g., a defoaming agent and a water softener, can also be added to the developing solution. As examples of the water softener, polyphosphate, e.g., $Na_2P_2O_7$, $Na_5P_3O_3$, $Na_3P_3O_9$, $Na_2O_4P(NaO_3P)PO_3Na_2$, and Calgon® (sodium polymetaphosphate), aminopolycarboxylic acids (e.g., ethylenediaminetetraacetic acid, potassium salt thereof and sodium salt thereof; diethylenetriaminepentaacetic acid, potassium salt thereof and sodium salt thereof; triethylenetetraminehexaacetic acid, potassium salt thereof and sodium salt thereof; hydroxyethylethylenediaminetriacetic acid, potassium salt thereof and sodium salt thereof; nitrilotriacetic acid, potassium salt thereof and sodium salt thereof; 1,2-diaminocyclohexanetetraacetic acid, potassium salt thereof and sodium salt thereof; 1,3-diamino-2-propanoltetraacetic acid, potassium salt thereof and sodium salt thereof), other polycarboxylic acids (e.g., 2-phosphonobutanetricarboxylic acid-1,2,4, potassium salt thereof and sodium salt thereof; 2-phosphonobutanonetricarboxylic acid-2,3,4, potassium salt thereof and sodium salt thereof), organic phosphonic acids (e.g., 1-phosphonoethanetricarboxylic acid-1,2,2, potassium salt thereof and sodium salt thereof; 1-hydroxyethane-1,1-diphosphonic acid, potassium salt thereof and sodium salt thereof; and aminotri(methylenephosphonic acid), potassium salt thereof and sodium salt thereof) are exemplified. Although the optimal amount of the water softener may vary according to the hardness and the amount of the hard water to be used, the amount thereof is ordinarily from 0.01 to 5 wt %, preferably from 0.01 to 0.5 wt % in the developing solution in use.

Further, when the lithographic printing plate precursor is subjected to development with an automatic developingmachine, since the developing solution fatigues with the increase of processing amount, a replenisher or a fresh developing solution may be supplied to restore the processing ability. In such a case, it is preferred to perform replenishment according to the method as disclosed in U.S. Pat. No. 4,882,246. Further, developing solutions as disclosed in JP-A-50-26601, JP-A-58-54341, JP-B-56-39464, JP-B-56-42860 and JP-B-57-7427 are also preferred.

The thus-development processed lithographic printing plate precursor maybe subjected to post processing with washing water, a rinsing solution containing a surfactant, and a desensitizing solution containing gum arabic or a starch derivative as disclosed in JP-A-54-8002, JP-A-55-115045 and JP-A-59-58431. In the post processing of the lithographic printing plate precursor of the invention, these processes may be combined variously.

In the plate-making of the lithographic printing plate precursor of the invention, it is effective for the developed image to be subjected to whole post heating or whole light exposure for the purpose of improving image strength and press life.

Extremely strong conditions can be utilized in the post-development heating. The heating temperature is ordinarily from 200 to 500° C. When the temperature of the post-development heating is too low, sufficient image strengthening effect cannot be obtained, while too high the temperature may result in the deterioration of the support and the thermal decomposition of the image area.

A lithographic printing plate obtained by the process is mounted on an offset printing machine and used in printing to provide a plenty of sheets.

As a plate cleaner used in the printing for removing stain on the printing plate, conventionally well-known PS plate cleaner is used and, e.g., CL-1, CL-2, CP, CN-4, CN, CG-1, PC-1, SR and IC (manufactured by Fuji Photo Film Co., Ltd.) are exemplified.

The present invention will be described in more detail with reference to the following examples, but the present invention is not limited thereto.

EXAMPLE 1

Manufacture of Support:

JIS A 1050 aluminum sheet having a thickness of 0.30 mm and a width of 1,030 mm was subjected to surface treatment as follows.

Surface Treatment:

The following surface treatments (a) to (f) were performed continuously. After each treatment and water washing, the liquid was squeezed with nip rollers.

(a) The aluminum sheet was subjected to etching treatment with an aqueous solution containing a sodium hydroxide in concentration of 26 wt % and an aluminum ion in concentration of 6.5 wt % at 70° C., whereby the aluminum sheet was dissolved in an amount of 5 $g/m^2$. The aluminum sheet was then washed with water.

(b) The aluminum sheet was subjected to desmut treatment by spraying with an aqueous solution containing a nitric acid in concentration of 1 wt % (containing 0.5 wt % of aluminum ion) at 30° C., and then the.aluminum sheet was washed with water.

(c) Electrochemical surface roughening treatment was performed continuously by alternating voltage of 60 Hz. An electrolyte used was an aqueous solution containing 1 wt % of nitric acid (containing 0.5 wt % of aluminum ion and 0.007 wt % of ammonium ion) and the temperature was 30° C. Regarding an alternating current electric source, the time TP required for the electric current value to reach the peak from 0 was 2 msec, the duty ratio was 1/1, and the electrochemical surface roughening treatment was performed using trapezoidal rectangular waveform alternating current with a carbon electrode as a counter electrode. Ferrite was used as an auxiliary anode. The electric current density was 25 $A/dM^2$ at a peak value of electric current, and the quantity of electricity was 250 $C/dm^2$ in the quantity of electricity of sum total in the case where the aluminum sheet was the anode. Five percent of the electric current from the electric source was diverted to the auxiliary anode. The aluminum sheet was then washed with water.

(d) The aluminum sheet was subjected to etching treatment by spraying with an aqueous solution comprising sodium hydroxide in concentration of 26 wt % and aluminum ion in concentration of 6.5 wt % at 35° C., whereby the aluminum sheet was dissolved in an amount of 0.2 g/$m^2$, and a smut component mainly comprising aluminum hydroxide formed when the electrochemical surface roughening treatment was performed by alternating voltage in the prior stage was removed, and also the edge parts of the pits formed were dissolved to smooth the edge parts, and then the aluminum sheet was washed with water.

(e) Desmut treatment was performed by spraying with an aqueous solution containing a sulfuric acid in concentration of 25 mass % (containing 0.5 wt % of aluminum ion) at 60° C., and then the aluminum sheet was washed with water by spraying.

(f) Anodizing treatment was performed in an electrolyte containing sulfuric acid in concentration of 170 g/liter (containing 0.5 wt % of aluminum ion) at 33° C. by electric current density of 5 A/$dm^2$ for 50 seconds. The aluminum sheet was then washed with water. The amount of the anodic oxide film formed was 2.7 g/$m^2$.

Photosensitive Layer:

A photosensitive layer coating solution (P-1) shown below was prepared, and the coating solution was coated on the above aluminum sheet with a wire bar. The coated layer was dried with a hot air drier at 122° C. for 27 seconds to prepare a photosensitive layer. The coating amount after drying was 1.3 g/$m^2$.

Photosensitive Layer Coating Solution (P-1):

| | |
|---|---|
| Infrared absorber (IR-1) | 0.074 g |
| Polymerization initiator (OS-1) | 0.311 g |
| Additive (PM-1) | 0.151 g |
| Polymerizable compound (AM-1) | 1.00 g |
| Binder polymer (BT-1) | 1.00 g |
| Ethyl Violet (C-1) | 0.04 g |
| Fluorine surfactant<br>(Megafac F-780-F, manufactured by Dainippon Ink and Chemicals Inc., MIBK 30 wt % solution) | 0.015 g |
| Methyl ethyl ketone | 10.4 g |
| Methanol | 4.83 g |
| 1-Methoxy-2-propanol | 10.4 g |

The structures of Infrared absorber (IR-1), Additive (PM-1), Polymerizable compound (AM-1), Binder polymer (BT-1), and Ethyl Violet (C-1) used in the photosensitive layer coating solution are shown below.

[IR-1]

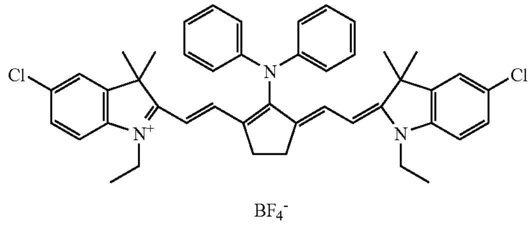

[PM-1]

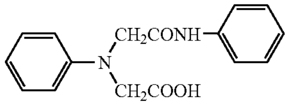

[AM-1]

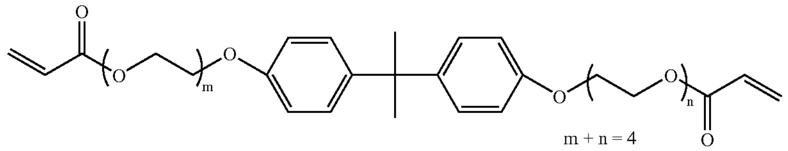

m + n = 4

[BT-1]

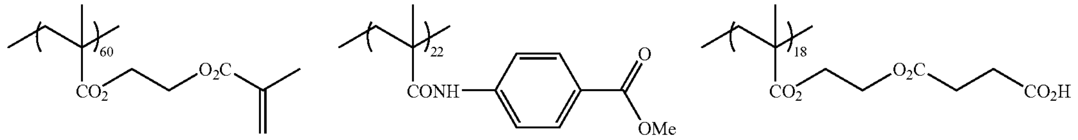

-continued

[C-1]

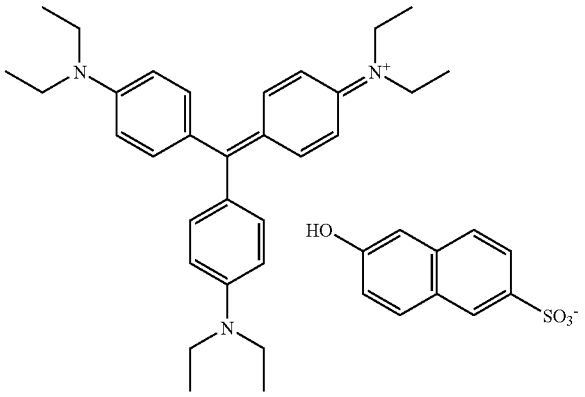

Protective Layer (Overcoat Layer):

On the surface of the photosensitive layer, a mixed aqueous solution containing polyvinyl alcohol (degree of saponification: 98 mole, degree of polymerization; 500) and polyvinyl pyrrolidone (Rubiscole K-30, manufactured by BASF Japan Ltd.) with a wire bar and dried with a hot air drier at 125° C. for 75 seconds.

The weight ratio of polyvinyl alcohol/polyvinyl pyrrolidone was 4/1 and the coating amount (coating amount after drying) was 2.30 g/$m^2$. Thus, a lithographic printing plate precursor for Example 1 was obtained.

EXAMPLES 2 TO 7 AND COMPARATIVE EXAMPLE 1

Each of the lithographic printing plate precursors of Examples 2 to 7 and Comparative Example 1 was prepared by forming a photosensitive layer and a protective layer in the same manner as in Example 1 except for using a photosensitive layer coating solution prepared by changing Polymerizable compound (AM-1) and the amount of 1.00 g used in photosensitive layer coating solution (P-1) in Example 1 to the polymerizable compound and the addition amount shown in Table 1 below.

Polymerizable compounds (AM-2) to (AM-4) used in Examples 2 to 7 and Comparative Example 1 are shown below.

[AM-2]

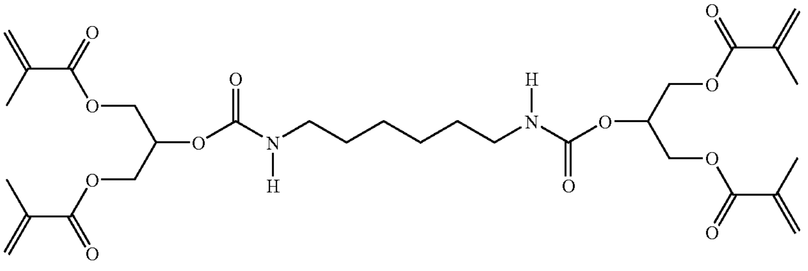

[AM-3]

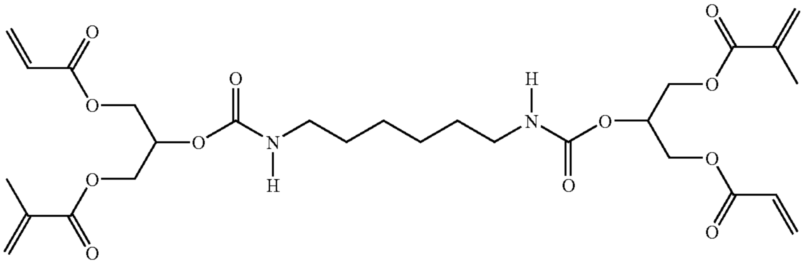

-continued

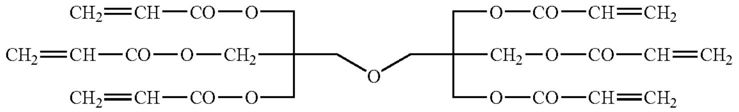

[AM-4]

Evaluation:

(1) Evaluation of Sensitivity

Each of the lithographic printing plate precursors obtained was subjected to exposure with Trendsetter 3244VX (manufactured by Creo Products Incorporated) loading a water-cooling type 40 W infrared semiconductor laser on the conditions of resolution of 175 lpi, external drum rotating speed of 150 rpm, and output in the range of from 0 to 8 W varying by 0.15's by log E, at 25° C. 50% RH. The protective layer was removed by washing with city water after the exposure, and each lithographic printing plate precursor was developed with LP-1310HII (manufactured by Fuji Photo Film Co., Ltd.) at 30° C. for 12 seconds. As a developing solution, 1/4 water dilution solution of DV-2 (manufactured by Fuji Photo Film Co., Ltd.), and as a finisher, 1/1 water dilution solution of GN-2K (manufactured by Fuji Photo Film Co., Ltd.) were respectively used.

The cyan density of the image area of the lithographic printing plate obtained by development was measured with a Macbeth densitometer RD-918 through a red filter loaded in the densitometer. The reciprocal of the exposure amount necessary to obtain density of 0.8 measured was taken as the index of sensitivity. With respect to the result of evaluation, the sensitivity of the lithographic printing plate for Comparative Example 1 was taken as 100, and the sensitivities of other lithographic printing plates were expressed as relative values. The greater the value, the higher is the sensitivity. The results obtained are shown in Table 1 below.

(2) Evaluation of Storage Stability before Exposure (Evaluation of Aging Stability)

An unexposed lithographic printing plate precursor was preserved at 45° C. 75% RH for three days, and then subjected to exposure and development as described below, and density of the non-image area was measured with a Macbeth densitometer RD-918. Further, a lithographic printing plate precursor immediately after production was also exposed and developed and the density of non-image area was measured in the same manner as above. The difference in the density of the non-image areas (Admin) was obtained and was taken as the index of storage stability before exposure. The smaller the value of admin, the better is the storage stability before exposure. The value of 0.02 or less is a practicable level. The results obtained are shown in Table 1 below.

Exposure and Development:

The lithographic printing plate precursor was subjected to exposure of the resolution of 175 lpi of a solid density image with Trendsetter 3244VX (manufactured by Creo Products Incorporated) loading a water-cooling type 40 W infrared semiconductor laser on the conditions of output of 8W, external drum rotating speed of 206 rpm and the quantity of printing plate exposure energy of 100 mJ/m$^2$. The protective layer was removed by washing with city water after the exposure, and the exposed lithographic printing plate precursor was subjected to development in the same manner as in the development process of the evaluation of sensitivity.

(3) Evaluation of Press Life

A lithographic printing plate precursor was subjected to exposure an 80% dot image of the resolution of 175 lpi with Trendsetter 3244VX (manufactured by Creo Products Incorporated) loading a water-cooling type 40 W infrared semiconductor laser on the conditions of output of 8 W, external drum rotating speed of 206 rpm and the quantity of printing plate exposure energy of 100 mJ/M$^2$. The protective layer was removed by washing with city water after the exposure, and the exposed lithographic printing plate precursor was subjected to development in the same manner as in the development process of the evaluation of sensitivity. The lithographic printing plate obtained was mounted on a printer (Lithrone, manufactured by Komori Corporation) to conduct printing, while ink was wiped from the surface of the printing plate with a multi-cleaner (manufactured by Fuji Photo Film co., Ltd.) every 10,000 sheets printing.

The press life was relatively evaluated taking a number of the printed sheets in Comparative Example 1 as 100%. The results obtained are shown in Table 1 below. In Table 1, the term "ordinary" means the press life of printing plate that was not wiped with the cleaner, and the term "cleaner" means the press life of printing plate that was subjected to the repeating operation of wiping with the cleaner.

TABLE 1

| | | Example | | | | | | | Comparative Example |
|---|---|---|---|---|---|---|---|---|---|
| | | 1 | 2 | 3 | 4 | 5 | 6 | 7 | 1 |
| Polymerizable | AM-1 | 1.00 | 0.50 | 0.75 | 0.82 | 0.95 | 0.82 | 0.95 | — |
| Compound | AM-2 | — | 0.50 | 0.25 | 0.18 | 0.05 | — | — | — |
| | AM-3 | — | — | — | — | — | 0.18 | 0.05 | — |
| | AM-4 | — | — | — | — | — | — | — | 1.00 |
| Sensitivity (mJ/cm$^2$) | | 45 | 45 | 40 | 35 | 45 | 40 | 35 | 55 |

TABLE 1-continued

| | | Example | | | | | | | Comparative Example |
|---|---|---|---|---|---|---|---|---|---|
| | | 1 | 2 | 3 | 4 | 5 | 6 | 7 | 1 |
| Press life (%) | Ordinary | 150 | 130 | 130 | 150 | 140 | 160 | 150 | 100 |
| | Cleaner | 130 | 130 | 160 | 200 | 180 | 220 | 200 | 100 |
| Storage stability before exposure (Δdmin) | | 0.00 | 0.00 | 0.00 | 0.00 | 0.00 | 0.00 | 0.00 | 0.03 |

As is apparent from Table 1, the lithographic printing plate precursors for Examples 1 to 7 are capable of high sensitivity recording and excellent in both press life and storage stability before exposure as compared with the lithographic printing plate precursor for Comparative Example 1.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising;

(A) a polymerizable compound represented by the following formula (I):

$$A—\{O—[(CH(—R^1)CH(—R^2))_m—O]_n—C(=O)—C(—R^3)=CH_2\}_p \quad (I)$$

wherein $R^1$, $R^2$ and $R^3$ each represents a hydrogen atom or a methyl group, A represents a polyhydric phenol residue, m represents an integer of from 1 to 6, n represents an integer of from 2 to 10, and p represents an integer of from 1 to 6;

(B) an infrared absorber; and (C) an onium salt, wherein an amount of the polymerizable compound represented by formula (I) is from 75 to 100 wt % based on the total polymerizable compounds contained in the photosensitive composition.

2. The photosensitive composition as claimed in claim 1, which further comprises a polymerizable compound having a urethane skeleton.

3. The photosensitive composition as claimed in claim 2, wherein the amount of the polymerizable compound having a urethane skeleton is from 2 to 25 wt % based on the total polymerizable compounds contained in the photosensitive composition.

4. The photosensitive composition as claimed in claim 2, wherein the amount of the polymerizable compound having a urethane skeleton is from 5 to 20 wt % based on the total polymerizable compounds contained in the photosensitive composition.

5. The photosensitive composition as claimed in claim 1, wherein the onium salt is a compound represented by the following formula (1):

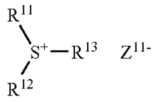
(1)

wherein, $R^{11}$, $R^{12}$ and $R^{13}$, which may be the same or different, each represents a hydrocarbon group having 20 or less carbon atoms which may have a substituent; and $Z^{11-}$ represents a counter ion selected from the group consisting of a halogen ion, a perchlorate ion, a tetrafluoroborate ion, a hexafluorophosphate ion, a carboxylate ion and a sulfonate ion.

6. The photosensitive composition as claimed in claim 1, which further comprises (D) a binder polymer having a crosslinkable group.

7. The photosensitive composition as claimed in claim 6, wherein the binder polymer having a crosslinkable group contains an alkali-soluble group selected from the group consisting of (1) a phenolic hydroxyl group (—Ar—OH)

(2) a sulfonamide group ($—SO_2NH—R$)

(3) a substituted sulfonamide-based acid group ($—SO_2NHCOR$, $—SO_2NHSO_2R$ or $—CONHSO_2R$)

(4) a carboxylic acid group ($—CO_2H$)

(5) a sulfonic acid group ($—SO_3H$), and (6) a phosphoric acid group ($—OPO_3H_2$)

wherein Ar represents a divalent aryl linking group which may have a substituent; and R represents a hydrogen atom or a hydrocarbon group which may have a substituent.

8. The photosensitive composition as claimed in claim 6, wherein the binder polymer having a crosslinkable group contains a structural unit represented by the following formula (i):

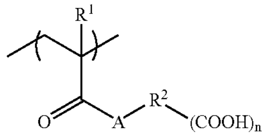
(i)

wherein $R^1$ represents a hydrogen atom or a methyl group; $R^2$ represents a linking group comprising one or more atoms selected from the group consisting of a carbon atom, a hydrogen atom, an oxygen atom, a nitrogen atom and a sulfur atom; A represents an oxygen atom or $—NR^3—$; $R^3$ represents a hydrogen atom or a monovalent hydrocarbon group having from 1 to 10 carbon atoms; and n represents an integer of from 1 to 5.

9. A lithographic printing plate precursor comprising a support having thereon a photosensitive layer containing the photosensitive composition as claimed in claim 1.

10. The lithographic printing plate precursor as claimed in claim 9, which further comprises a protective layer on the photosensitive layer.

11. The lithographic printing plate precursor as claimed in claim 10, wherein the protective layer comprises a water-soluble polymer selected from polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid and polyacrylamide.

12. The photosensitive composition as claimed in claim 1, wherein the amount of the polymerizable compound represented by formula (I) is from 80 to 100 wt % based on the total polymerizable compounds contained in the photosensitive composition.

13. A photosensitive composition comprising:

(A) a polymerizable compound represented by the following formula (I):

$$A—\{O—[(CH(—R^1)CH(—R^2))_m—O]_n—C(=O)—C(—R^3)=CH_2\}_p \quad (I)$$

wherein $R^1$, $R^2$ and $R^3$ each represents a hydrogen atom or a methyl group, A represents a polyhydric alcohol residue, m represents an integer of from 1 to 6, n represents an integer of from 2 to 10, and p represents an integer of from 1 to 6;

(B) an infrared absorber; and (C) an onium salt, wherein the amount of the polymerizable compound represented by formula (I) is from 75 to 100 wt % based on the total polymerizable compounds contained in the photosensitive composition.

14. The photosensitive composition as claimed in claim 13, which further comprises a polymerizable compound having a urethane skeleton.

15. The photosensitive composition as claimed in claim 14, wherein the amount of the polymerizable compound having a urethane skeleton is from 2 to 25 wt % based on the total polymerizable compounds contained in the photosensitive composition.

16. The photosensitive composition as claimed in claim 14, wherein the amount of the polymerizable compound having a urethane skeleton is from 5 to 20 wt % based on the total polymerizable compounds contained in the photosensitive composition.

17. The photosensitive composition as claimed in claim 13, wherein the onium salt is a compound represented by the following formula (1):

(1)

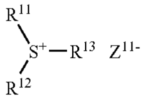

wherein $R^{11}$, $R^{12}$ and $R^{13}$, which may be the same or different, each represents a hydrocarbon group having 20 or less carbon atoms which may have a substituent; and $Z^{11-}$ represents a counter ion selected from the group consisting of a halogen ion, a perchiorate ion, a tetrafluoroborate ion, a hexafluorophosphate ion, a carboxylate ion and a sulfonate ion.

18. The photosensitive composition as claimed in claim 13, which further comprises (D) a binder polymer having a crosslinkable group.

19. The photosensitive composition as claimed in claim 18, wherein the binder polymer having a crosslinkable group contains an alkali-soluble group selected from the group consisting of (1) a phenolic hydroxyl group (—Ar—OH)

(2) a sulfonamide group ($—SO_2NH—R$)

(3) a substituted sulfonamide-based acid group ($—SO_2NHCOR$, $—SO_2NHSO_2R$ or $—CONHSO_2R$)

(4) a carboxylic acid group ($—CO_2H$)

(5) a sulfonic acid group ($—SO_3H$), and (6) a phosphoric acid group ($—OPO_3H_2$)

wherein Ar represents a divalent aryl linking group which may have a substituent; and R represents a hydrogen atom or a hydrocarbon group which may have a substituent.

20. The photosensitive composition as claimed in claim 18, wherein the binder polymer having a crosslinkable group contains a structural unit represented by the following formula (i):

(i)

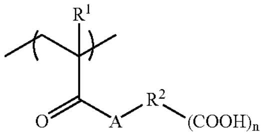

wherein $R^1$ represents a hydrogen atom or a methyl group; $R^2$ represents a linking group comprising one or more atoms selected from the group consisting of a carbon atom, a hydrogen atom, an oxygen atom, a nitrogen atom and a sulfur atom; A represents an oxygen atom or $—NR^3—$; $R^3$ represents a hydrogen atom or a monovalent hydrocarbon group having from 1 to 10 carbon atoms; and n represents an integer of from 1 to 5.

21. A lithographic printing plate precursor comprising a support having thereon a photosensitive layer containing the photosensitive composition as claimed in claim 13.

22. The lithographic printing plate precursor as claimed in claim 21, which further comprises a protective layer on the photosensitive layer.

23. The lithographic printing plate precursor as claimed in claim 22, wherein the protective layer comprises a water-soluble polymer selected from polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid and polyacrylamide.

24. The photosensitive composition as claimed in claim 13, wherein the amount of the polymerizable compound represented by formula (I) is from 80 to 100 wt % based on the total polymerizable compounds contained in the photosensitive composition.

* * * * *